United States Patent
Saito et al.

(10) Patent No.: US 12,340,975 B2
(45) Date of Patent: Jun. 24, 2025

(54) PLASMA PROCESSING APPARATUS

(71) Applicant: Tokyo Electron Limited, Tokyo (JP)

(72) Inventors: Takehisa Saito, Miyagi (JP); Yoshihiro Umezawa, Miyagi (JP); Naoki Fujiwara, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 91 days.

(21) Appl. No.: 17/361,868

(22) Filed: Jun. 29, 2021

(65) Prior Publication Data

US 2022/0005672 A1  Jan. 6, 2022

(30) Foreign Application Priority Data

Jul. 2, 2020  (JP) .................. 2020-115108

(51) Int. Cl.
*H01J 37/32*  (2006.01)

(52) U.S. Cl.
CPC ..... *H01J 37/3211* (2013.01); *H01J 37/32119* (2013.01); *H01J 2237/334* (2013.01)

(58) Field of Classification Search
CPC .............. H01J 37/321; H01J 37/3211; H01J 37/3222; H01J 37/32119; H01J 2237/334
See application file for complete search history.

(56) References Cited

U.S. PATENT DOCUMENTS

| | | | | |
|---|---|---|---|---|
| 5,716,451 A | * | 2/1998 | Hama | H01J 37/321 |
| | | | | 118/723 I |
| 6,063,233 A | * | 5/2000 | Collins | H01J 37/32467 |
| | | | | 118/724 |
| 6,076,482 A | * | 6/2000 | Ding | H01J 37/32458 |
| | | | | 438/758 |
| 6,534,922 B2 | * | 3/2003 | Bhardwaj | H01J 37/321 |
| | | | | 315/111.21 |
| 9,137,884 B2 | * | 9/2015 | Vinogradov | H01J 37/32174 |
| 2002/0060523 A1 | | 5/2002 | Bhardwaj et al. | |

(Continued)

FOREIGN PATENT DOCUMENTS

| | | |
|---|---|---|
| JP | 0888190 A | 4/1996 |
| JP | H09228056 A | 9/1997 |

(Continued)

*Primary Examiner* — Benjamin Kendall
*Assistant Examiner* — Joshua Reyes
(74) *Attorney, Agent, or Firm* — Nath, Goldberg & Meyer; Jerald L. Meyer; Tanya E. Harkins

(57) ABSTRACT

A plasma processing apparatus includes a chamber; a dielectric window, a first antenna for generating plasma within the chamber, and a first power supply for supplying RF power to the first antenna. Power is fed to a first line constituting the first antenna from the first power supply and the vicinity of the midpoint is grounded so that the first antenna resonates at a wavelength that is ½ of a wavelength of the RF power. The first antenna includes a first portion close to a first end with reference to a first position separated from the first end by a first distance toward a central portion of the first line, a second portion close to a second end with reference to a second position separated from the second end by a second distance toward the central portion, and a first intermediate portion between the first and second portions.

14 Claims, 14 Drawing Sheets

(56) References Cited

U.S. PATENT DOCUMENTS

| | | | |
|---|---|---|---|
| 2007/0074813 A1* | 4/2007 | Okumura | H01J 37/321 257/E21.143 |
| 2008/0223521 A1* | 9/2008 | Kim | H01J 37/321 156/345.1 |
| 2010/0269980 A1* | 10/2010 | Nishimura | H01J 37/3211 156/345.48 |
| 2012/0270406 A1* | 10/2012 | Tahara | H01J 37/32853 134/1.2 |
| 2018/0073146 A1 | 3/2018 | Kato et al. | |
| 2019/0098740 A1* | 3/2019 | Yamazawa | H01J 37/3211 |

FOREIGN PATENT DOCUMENTS

| | | |
|---|---|---|
| JP | 2006344998 A | 12/2006 |
| JP | 2010-258324 A | 11/2010 |
| JP | 2012156261 A | 8/2012 |
| JP | 201841685 A | 3/2018 |
| KR | 1020120086264 A | 8/2012 |
| KR | 1020180028937 A | 3/2018 |

\* cited by examiner

PLASMA PROCESSING APPARATUS

CROSS-REFERENCE TO RELATED APPLICATION

This application is based upon and claims the benefit of priority from Japanese Patent Application No. 2020-115108, filed on Jul. 2, 2020, the entire contents of which are incorporated herein by reference.

TECHNICAL FIELD

Various aspects and embodiments of the present disclosure relate to a plasma processing apparatus.

BACKGROUND

As a processing apparatus that executes a semiconductor manufacturing process, a plasma processing apparatus in which a processing gas is plasmarized to perform etching, film formation processing, or the like is known. For example, in a single-wafer type plasma processing apparatus, it is required to be able to adjust plasma density distribution in the plane direction of a substrate to an appropriate value depending on the processing type. Specifically, such adjustment may be made based on an internal structure of the processing container, or may be made to cope with the unevenness of processing in the plane of the substrate in post-processing. Therefore, the plasma density distribution is not limited to being uniformly processed in the entire plane of the substrate, and the plasma density distribution may be intentionally made to be different between the central portion and the peripheral portion of the substrate.

As a method of generating plasma in a plasma processing apparatus, for example, there is a method of supplying radio-frequency power to an antenna so as to generate an induced electric field inside a processing container and to excite a processing gas (see, for example, Patent Document 1 below). In this method, a coiled inner antenna and a coiled outer antenna in a concentric relationship with the inner antenna are provided as antennas for outputting radio-frequency waves, and each antenna is resonated at a wavelength that is ½ of wavelength of the radio-frequency waves. According to this plasma processing apparatus, it is possible to finely adjust the in-plane distribution of plasma density by independently controlling the radio-frequency power supplied to each antenna.

PRIOR ART DOCUMENT

[Patent Document]
Patent Document 1: Japanese Laid-Open Patent Publication No. 2010-258324

SUMMARY

A plasma processing apparatus includes: a chamber in which a substrate is accommodated; a dielectric window constituting an upper portion of the chamber; a first antenna provided above the chamber via the dielectric window, and formed of a conductive material in a linear shape, the first antenna being configured to generate plasma within the chamber by radiating radio frequency (RF) power into the chamber; and a first power supply configured to supply the RF power to the first antenna, wherein opposite ends of a first line constituting the first antenna are open, power is fed to a midpoint of the first line or a vicinity of the midpoint from the first power supply, and the vicinity of the midpoint is grounded so that the first antenna is configured to resonate at a wavelength that is ½ of a wavelength of the RF power supplied from the first power supply, and wherein the first antenna includes: a first portion that is a portion of the first antenna at a side close to a first end, which is one of the opposite ends of the first line, with reference to a first position separated from the first end by a first distance toward a central portion of the first line; a second portion that is a portion of the first antenna at a side close to a second end, which is the other of the opposite ends of the first line, with reference to a second position separated from the second end by a second distance toward the central portion of the first line; and a first intermediate portion that is a portion of the first antenna between the first portion and the second portion, wherein a distance between the first portion and a bottom surface of the dielectric window and a distance between the second portion and the bottom surface of the dielectric window are each longer than a distance between the first intermediate portion and the bottom surface of the dielectric window.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, exemplary embodiments of a plasma processing apparatus disclosed herein will be described in detail with reference to the drawings. The substrate processing apparatus disclosed herein is not limited by the following embodiments. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In an antenna using a resonance phenomenon, the intensity of an electric field radiated from the antenna is higher at the end side of the antenna than at the center side of the antenna. Therefore, in the vicinity of the end of the antenna, charged particles such as ions may be attracted by the electric field radiated from the antenna, and a member in the vicinity of the end of the antenna may be sputtered by the attracted charged particles. As a result, contamination may occur from a member near the end of the antenna.

In addition, in the vicinity of the end of the antenna, since the intensity distribution of the electric field radiated from the antenna changes abruptly, the intensity distribution of the electric field radiated from the antenna is disturbed. As a result, the distribution of plasma is disturbed, and the uniformity of substrate processing may be degraded.

Therefore, the present disclosure provides a technique capable of suppressing the occurrence of contamination and improving the uniformity of processing.

First Embodiment

[Configuration of Plasma Processing Apparatus 10]

Figure 1:
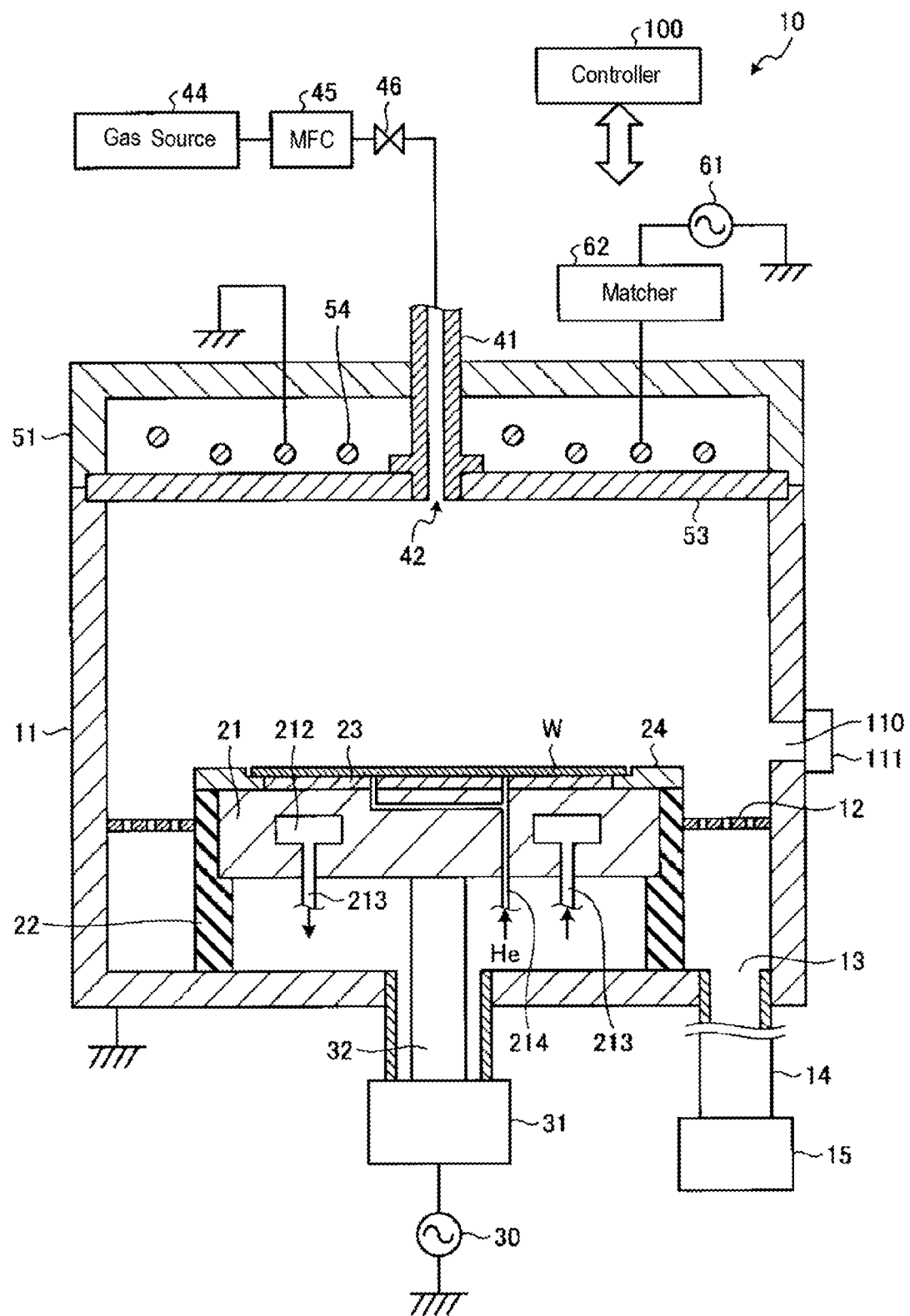
FIG. 1 is a schematic cross-sectional view illustrating an example of a plasma processing apparatus according to a first embodiment.

FIG. 1 is a schematic cross-sectional view illustrating an example of a plasma processing apparatus 10 in a first embodiment. The plasma processing apparatus 10 includes a chamber 11 formed of a conductor such as aluminum. An opening 110 for carrying in and out a substrate W is provided in the side surface of the chamber 11, and is configured to be capable of being opened and closed by a gate valve 111. The chamber 11 is grounded.

A disk-shaped susceptor 21, which is made of a conductive material such as aluminum, and on which the substrate W to be processed is placed, is provided substantially in the center of the bottom surface side of the chamber 11. The susceptor 21 also functions as an electrode for attracting ions in the plasma (for bias). The susceptor 21 is supported by a cylindrical susceptor support 22 made of an insulator.

In addition, an RF power supply 30 for bias is connected to the susceptor 21 via a feeding rod 32 and a matcher 31. RF power having a frequency of, for example, 13 MHz is supplied to the susceptor 21 from an RF power supply 30. The frequency and power of the RF power supplied from the RF power supply 30 to the susceptor 21 are controlled by a controller 100 to be described later.

An electrostatic chuck 23 configured to hold the substrate W by electrostatic attraction is provided on the top surface of the susceptor 21, and an edge ring 24 is provided on the outer peripheral side of the electrostatic chuck 23 so as to surround the periphery of the substrate W. The edge ring 24 is sometimes called a focus ring.

Inside the susceptor 21, for example, a flow path 212 configured to allow a coolant such as cooling water to flow therethrough is formed. The flow path 212 is connected to a chiller unit (not illustrated) via a pipe 213, and a temperature-controlled coolant is supplied from the chiller unit into the flow path 212 via the pipe 213. The temperature of the coolant in the chiller unit is controlled by the controller 100 to be described later.

Inside the susceptor 21, a gas supply pipe 214 is provided between the electrostatic chuck 23 and the substrate W so as to supply a heat transfer gas such as a He gas. The gas supply pipe 214 penetrates the electrostatic chuck 23. An internal space of the gas supply pipe 214 communicates with a space between the electrostatic chuck 23 and the substrate W.

In addition, an annular baffle plate 12 having a large number of through-holes formed therein is provided between the outer wall of the susceptor support 22 and the inner wall of the chamber 11. An exhaust port 13 is formed in the bottom surface of the chamber 11, and the exhaust port 13 is connected to an exhaust device 15 via an exhaust pipe 14. The exhaust device 15 is controlled by the controller 100 to be described later.

A disk-shaped dielectric window 53 formed of a dielectric material, such as quartz, is provided in the upper portion of the chamber 11. The dielectric window 53 constitutes the upper portion of the chamber 11. A space above the dielectric window 53 is covered with a shield box 51 formed of a conductor, such as aluminum, in a cylindrical shape. The shield box 51 is grounded via the chamber 11. An opening is formed in the center of the shield box 51 and the dielectric window 53. The opening is provided with a gas supply pipe 41 for supplying the processing gas into the chamber 11.

A gas source 44 is connected to the gas supply pipe 41 via a valve 46 and a mass flow controller (MFC) 45. In the present embodiment, the gas source 44 is a source of a processing gas for etching, such as a $CF_4$ gas or a chlorine gas. The MFC 45 controls a flow rate of the processing gas supplied from the gas source 44. The valve 46 controls the supply and cutoff of the processing gas, the flow rate of which is controlled by the MFC 45, into the gas supply pipe 41. The processing gas supplied into the gas supply pipe 41 is supplied into the chamber 11 via an injection part 42.

An antenna 54 constituted with a line formed of a conductive material is accommodated in a space above the chamber 11 and surrounded by the dielectric window 53 and the shield box 51. The antenna 54 generates plasma in the chamber 11 by radiating RF power into the chamber 11. The antenna 54 is an example of a first antenna, and the line constituting the antenna 54 is an example of a first line. The antenna 54 is provided around the gas supply pipe 41 so as to surround the gas supply pipe 41. An RF power supply 61 configured to supply RF power for plasma generation is connected to the line constituting the antenna 54 via a matcher 62. The RF power supply 61 supplies the RF power having a frequency of, for example, 27 MHz to the antenna 54 via the matcher 62. In addition, the antenna 54 is grounded at a position on the line different from the position on the line to which the RF power supply 61 is connected via the matcher 62. The RF power supply 61 is an example of a first power supply.

In the antenna 54 in the present embodiment, opposite ends of the line constituting the antenna 54 are open, the RF power supply 61 is connected to the midpoint of the line or the vicinity of the midpoint via the matcher 62, and the vicinity of the midpoint is grounded. As a result, the antenna 54 in the present embodiment resonates at a wavelength that is ½ of the wavelength of the RF wave power supplied from the RF power supply 61.

The controller 100 includes a memory such as a read only memory (ROM) or a random access memory (RAM), and a processor such as a central processing unit (CPU). Data such as recipes and programs are stored in a memory of the controller 100. The processor in the controller 100 reads and executes the program stored in the memory of the controller 100, thereby controlling each part of the plasma processing apparatus 10 based on data such as the recipe stored in the memory of the controller 100.

[Structure of Antenna 54]

Figure 2:
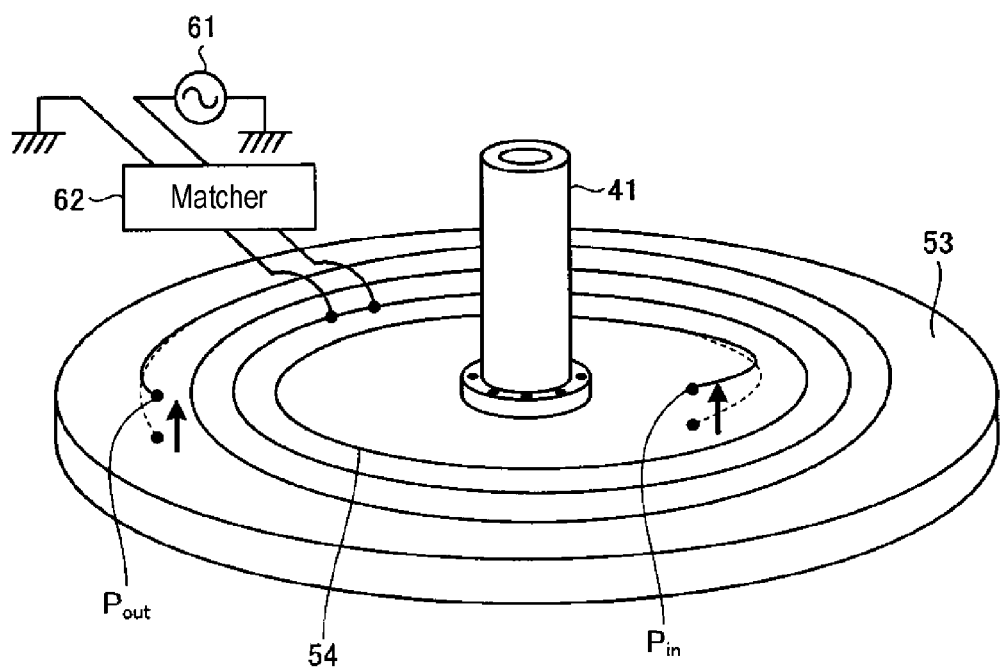
FIG. 2 is a schematic perspective view illustrating an example of an antenna in the first embodiment.

FIG. 2 is a schematic perspective view illustrating an example of the antenna 54 in the first embodiment. As illustrated in FIG. 2, for example, the antenna 54 in the present embodiment is formed in a substantially circular spiral shape with two or more turns. The vicinity of each end of the line constituting the antenna 54 in the present embodiment has, in a line range of a predetermined length from the end, a shape located above a plane in which the line outside the range is included, for example, as illustrated in FIG. 2. In the following, in the spirally formed line of the antenna 54, the end of the line located on the outside is defined as $P_{out}$, and the end of the line located on the inside is defined as $P_{in}$. The end $P_{out}$ is an example of a first end, and the end $P_{in}$ is an example of a second end.

Figure 3:
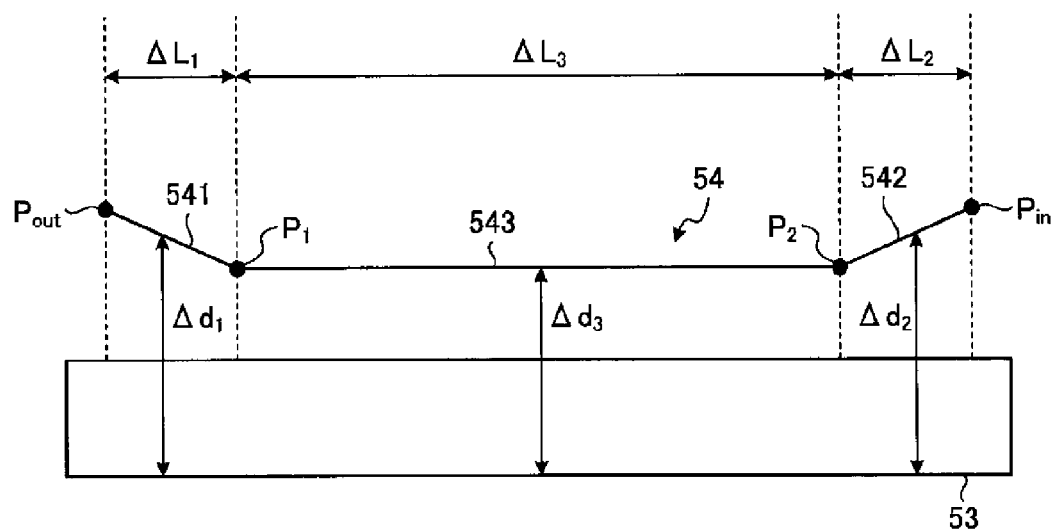
FIG. 3 is a schematic view illustrating an exemplary shape of the antenna in the first embodiment.

FIG. 3 is a schematic view illustrating an example of the shape of the antenna 54 in the first embodiment. FIG. 3 schematically illustrates an example of the antenna 54 and an example of the dielectric window 53 when the antenna 54 and the dielectric window 53 are deployed along the extension direction of the line constituting the antenna 54. In the present embodiment, the bottom surface of the dielectric window 53 (the surface opposite to the surface on the antenna 54 side) is flat.

In the example of FIG. 3, a position separated from the end $P_{out}$ by a predetermined distance $\Delta L_1$ along the line of the antenna 54 is defined as $P_1$, and a position separated from the end $P_{in}$ by a predetermined distance $\Delta L_2$ along the line of the antenna 54 is defined as $P_2$. In addition, in the example of FIG. 3, an end portion 541 is a line portion in a range at the side close to the end $P_{out}$ with reference to the position $P_1$, an end portion 542 is a line portion in a range at the side close to the end $P_{in}$ with reference to the position $P_2$, an intermediate portion 543 is a line portion in a range of a distance $\Delta L_3$ from the position $P_1$ to the position $P_2$. The position $P_1$ is an example of a first position, and the position $P_2$ is an example of a second position. In addition, the distance $\Delta L_1$ is an example of a first distance, and the distance $\Delta L_2$ is an example of a second distance. Furthermore, the end portion 541 is an example of a first portion, the end portion 542 is an example of a second portion, and the intermediate portion 543 is an example of a first intermediate portion.

In the present embodiment, as illustrated in FIG. 3, for example, the distance $\Delta d_1$ between the end portion 541 of the antenna 54 and the bottom surface of the dielectric window 53 is longer than the distance $\Delta d_3$ between the intermediate portion 543 of the antenna 54 and the bottom surface of the dielectric window 53. In addition, as illustrated in FIG. 3, for example, the distance $\Delta d_2$ between the end portion 542 of the antenna 54 and the bottom surface of the dielectric window 53 is longer than the distance $\Delta d_3$ between the intermediate portion 543 of the antenna 54 and the bottom surface of the dielectric window 53. The distance $\Delta d_1$ and the distance $\Delta d_2$ may be the same distance or different distances.

In addition, in the present embodiment, as illustrated in FIG. 3, for example, the distance $\Delta d_3$ between the intermediate portion 543 of the antenna 54 and the bottom surface of the dielectric window 53 is constant.

Furthermore, in the end portion 541 of the antenna 54 in the present embodiment, for example, as illustrated in FIG. 3, the distance between the end portion 541 and the bottom surface of the dielectric window 53 increases from the position $P_1$ to the end $P_{out}$ along the line of the antenna 54. Similarly, in the end portion 542 of the antenna 54 in the present embodiment, for example, as illustrated in FIG. 3, the distance between the end portion 542 and the bottom surface of the dielectric window 53 increases from the position $P_2$ to the end $P_{in}$ along the line of the antenna 54.

Figure 4:
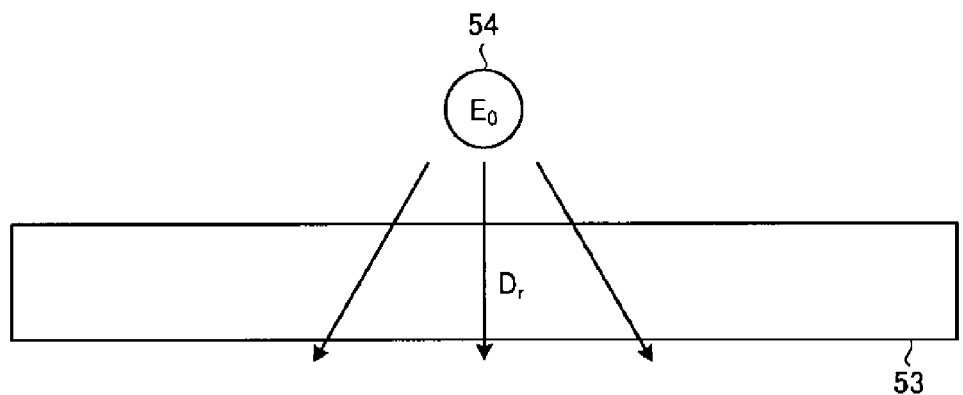
FIG. 4 is a view for explaining the distribution of electric field intensity radiated from then antenna.

Here, for example, as illustrated in FIG. 4, when electromagnetic waves of an electric field $E_0$ are radiated from the antenna 54, an electric flux density Dr at a point of a distance r from the antenna 54 is expressed by, for example, Equation 1 below.

[Equation 1]

$$D_r = \frac{\alpha E_0}{2\pi r} \quad (1)$$

In Equation 1 above, $\alpha$ is a proportionality constant.

When a length of the line constituting the antenna 54 is 2 L, a voltage V(x) generated on the line at a position spaced apart from the center of the line by a distance x along the line is expressed by, for example, Equation 2 below.

[Equation 2]

$$V(x) = V_m \sin\left(\frac{\pi}{2L}x\right) \quad (-L \leq x \leq L) \quad (2)$$

In Equation 2 above, $V_m$ is the maximum value of the voltage generated in the line.

Here, an electric field intensity $E_0(x)$ radiated from the line is proportional to the voltage $V(x)$ generated on the line. In addition, when a distance between the antenna 54 and the bottom surface of the dielectric window 53 is defined as $z(x)$, an electric field intensity $E(x)$ on the bottom surface of the dielectric window 53 is inversely proportional to the distance $z(x)$. Therefore, the electric field intensity $E(x)$ on the bottom surface of the dielectric window 53 is expressed by, for example, Equation 3 below.

[Equation 3]

$$E(x) = \alpha V_m \sin\left(\frac{\pi}{2L}x\right)\frac{1}{2\pi z(x)} \quad (3)$$

Figure 5A:
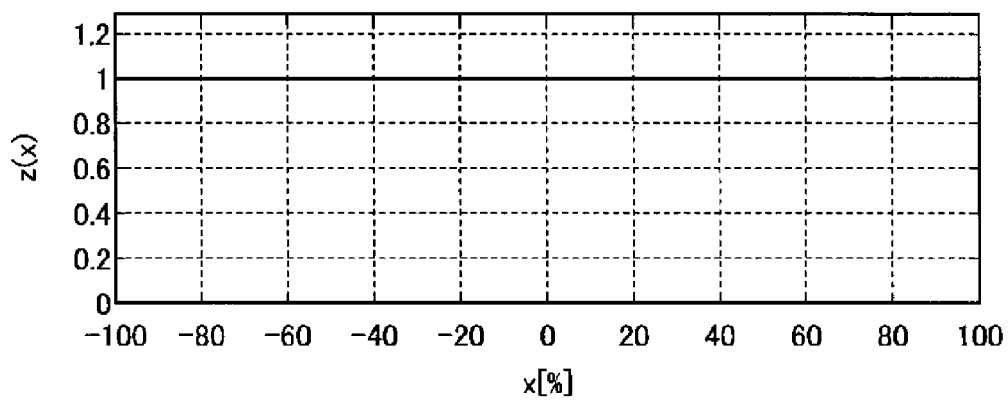
FIG. 5A is a view illustrating an example of distribution of a distance between an antenna and a bottom surface of a dielectric window.
Figure 5B:
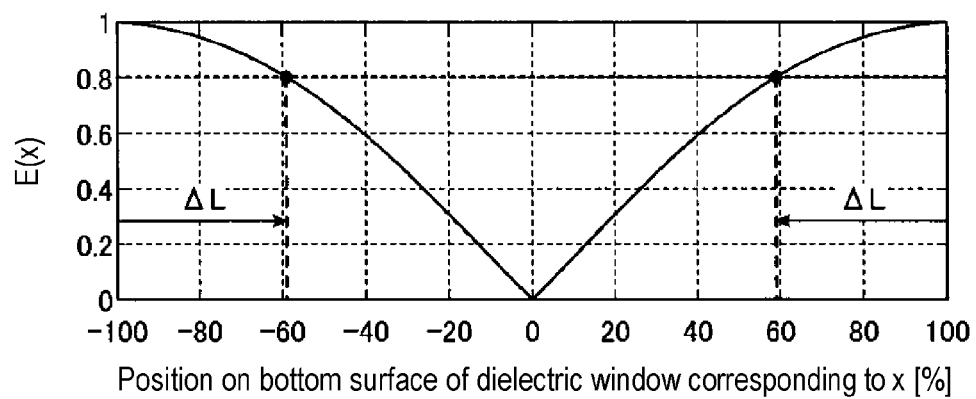
FIG. 5B is a view illustrating an example of distribution of electric field intensity on the bottom surface of the dielectric window.

For example, as illustrated in FIG. 5A, when the distance $z(x)$ between the antenna 54 and the bottom surface of the dielectric window 53 is constant over the entire line of the antenna 54, the electric field intensity $E(x)$ on the bottom surface of the dielectric window 53 is distributed, for example, as illustrated in FIG. 5B. FIG. 5A is a view illustrating an example of distribution of the distance $z(x)$ between the antenna 54 and the bottom surface of the dielectric window 53. FIG. 5B is a view illustrating an example of distribution of the electric field intensity $E(x)$ on the bottom surface of the dielectric window 53.

On the vertical axis of FIG. 5A, the distance $z(x)$ between the antenna 54 and the bottom surface of the dielectric window 53 is standardized to 1. In addition, on the horizontal axis of FIG. 5A, the distance on the line from the center to each end of the line is standardized by the length L with reference to the center of the line of the antenna 54 having a length of 2 L. On the vertical axis of FIG. 5B, the electric field intensity $E(x)$ at each position on the bottom surface of the dielectric window 53 corresponding to the line of the antenna 54 is standardized by the electric field intensity at the positions on the bottom surface of the dielectric window 53 corresponding to the ends of the line of the antenna 54. In addition, on the horizontal axis of FIG. 5B, the distance to each position on the bottom surface of the dielectric window 53 corresponding to the length from the center to the ends of the line is standardized by the length L with reference to the position of the bottom surface of the dielectric window 53 corresponding to the center of the line of the antenna 54 having a length of 2 L.

Here, the maximum electric field intensity at which contamination does not occur from the bottom surface of the dielectric window 53 even when the bottom surface of the dielectric window 53 is sputtered is defined as $E_{max}$. In order to prevent contamination from occurring from the bottom surface of the dielectric window 53, as expressed by, for example, Equation 4 below, the electric field intensity $E(x)$ on the bottom surface of the dielectric window 53 needs to be equal to or less than the electric field intensity $E_{max}$.

[Equation 4]

$$E_{max} \geq E(x) = \alpha V_m \sin\left(\frac{\pi}{2L}x\right)\frac{1}{2\pi z(x)} \quad (4)$$

According to Equation 4 above, the distance $z(x)$ between the antenna 54 and the bottom surface of the dielectric window 53 needs to satisfy Equation 5 below.

[Equation 5]

$$z(x) \geq \alpha V_m \sin\left(\frac{\pi}{2L}x\right)\frac{1}{2\pi E_{max}} \quad (5)$$

For example, in the distribution of the electric field intensity $E(x)$ illustrated in FIG. 5B, it is assumed that the maximum electric field intensity $E_{max}$ at which contamination does not occur from the bottom surface of the dielectric window 53 is 0.8 times the maximum value of the electric field intensity $E(x)$ on the bottom surface of the dielectric window 53. With reference to FIG. 5B, a range of the line of the antenna 54 that is 0.8 times or more the maximum value of the electric field intensity $E(x)$ on the bottom surface of the dielectric window 53 is the range from each end of the line to $\Delta L$. In this range, when the distance between the antenna 54 and the bottom surface of the dielectric window 53 is increased, it is possible to suppress the electric field intensity $E(x)$ on the bottom surface of the dielectric window 53 to a low level.

Therefore, in the range from each end of the line to $\Delta L$, it is conceivable to make the shape of the line curved so as to cancel the increase in the electric field intensity $E(x)$ on the bottom surface of the dielectric window 53. That is, it is conceivable to make the shape of the end portion 541 such that at each position on the line of the end portion 541, the distance $z(x)$ between the end portion 541 and the bottom surface of the dielectric window 53 is a distance corresponding to the magnitude of a voltage generated at the corresponding position. Similarly, it is conceivable to make the shape of the end portion 542 such that at each position on the line of the end portion 542, the distance $z(x)$ between the end portion 542 and the bottom surface of the dielectric window 53 is a distance corresponding to the magnitude of a voltage generated at the corresponding position. Such a curve is represented by, for example, Equation 6 below.

[Equation 6]

$$z(x) = \alpha V_m \sin\left(\frac{\pi}{2L}x\right)\frac{1}{2\pi E_{max}} \quad (6)$$

Figure 6:
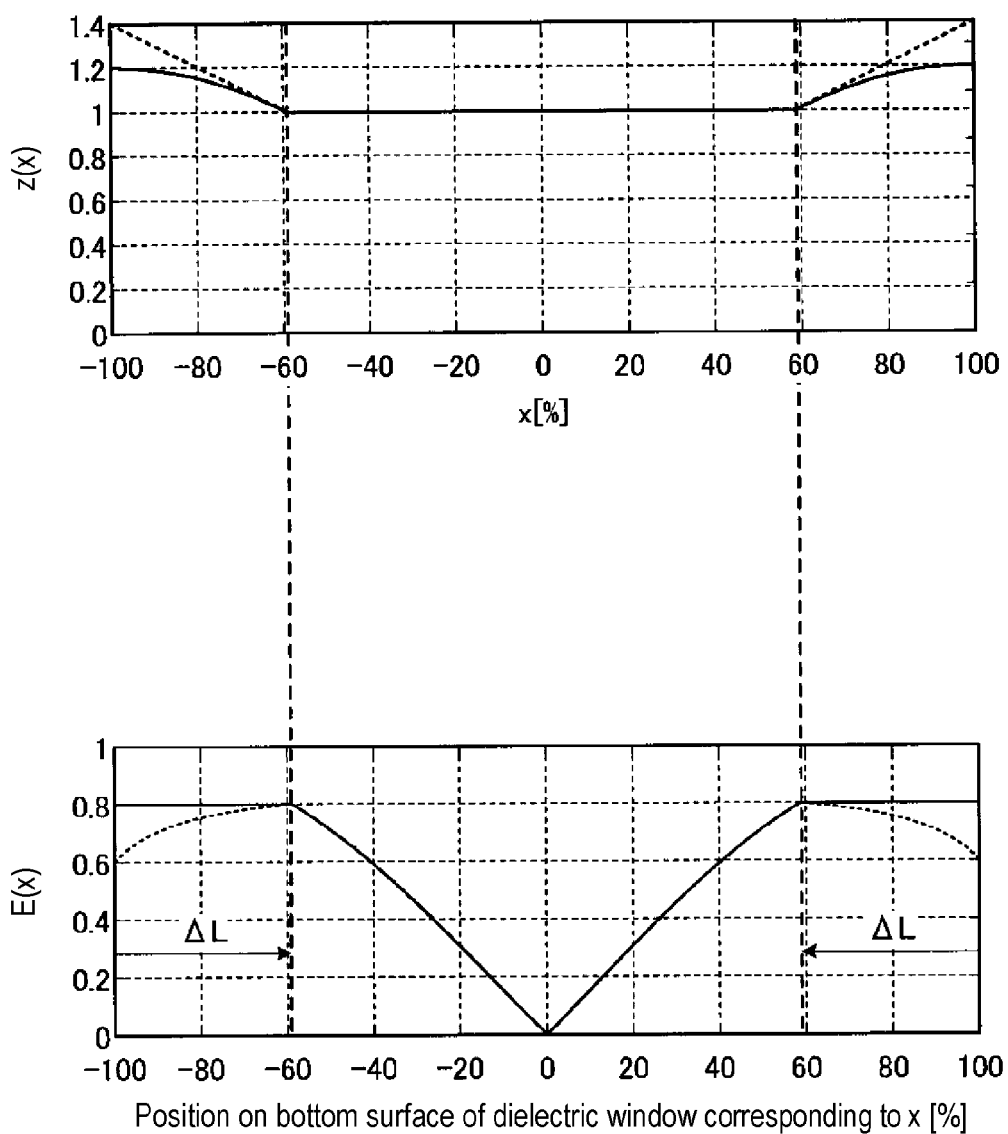
FIG. 6 is a diagram illustrating an example of distribution of a distance between the antenna and the bottom surface of the dielectric window and an example of distribution of electric field intensity on the bottom surface of the dielectric window.

In Equation 6 above, when $E_{max}$ is set to 0.8 times the maximum value of the electric field intensity of the bottom surface of the dielectric window 53, for example, when the distance between the antenna 54 and the bottom surface of the dielectric window 53 is constant, the shape of the antenna 54 in the range from each end to $\Delta L$ becomes, for example, that indicated by the solid line in the upper graph in FIG. 6. In this case, the electric field intensity $E(x)$ on the bottom surface of the dielectric window 53 corresponding to the range from each end of the line to $\Delta L$ is suppressed to 0.8 times the maximum value of the electric field intensity $E(x)$ on the bottom surface of the dielectric window 53, for example, as illustrated in the lower graph in FIG. 6. As described above, the distance between the end portion 541 and the bottom surface of the dielectric window 53 is a distance at which the electric field intensity generated on the bottom surface of the dielectric window 53 below the end portion 541 due to the voltage generated on the end portion 541 becomes equal to or less than a predetermined intensity. Similarly, the distance between the end portion 542 and the bottom surface of the dielectric window 53 is a distance at which the electric field intensity generated on the bottom surface of the dielectric window 53 below the end portion 542 due to the voltage generated on the end portion 542 becomes equal to or less than a predetermined intensity.

In the case of a shape in which the distance z(x) is longer than the distance z(x) expressed by Equation 6, for example, as indicated by the dotted line in the upper graph in FIG. 6, the electric field intensity generated on the bottom surface of the dielectric window 53 becomes lower than 0.8 times the maximum value of the electric field intensity E(x) on the bottom surface of the dielectric window 53, for example, as indicated by the dotted line in the lower graph in FIG. 6. From the viewpoint of ease of processing of the antenna 54, a shape in which the distance z(x) between the antenna 54 and the bottom surface of the dielectric window 53 increases at a constant rate of increase is preferable. Therefore, the antenna 54 of the present embodiment adopts a shape in which the distance z(x) between the antenna 54 and the bottom surface of the dielectric window 53 increases at a constant rate of increase. That is, in the present embodiment, the end portion 541 extends away from the bottom surface of the dielectric window 53, from the position $P_1$ to the end $P_{out}$ along the line of the antenna 54. In addition, the end portion 542 extends away from the bottom surface of the dielectric window 53, from the position $P_2$ to the end $P_{in}$ along the line of the antenna 54.

Figure 7:
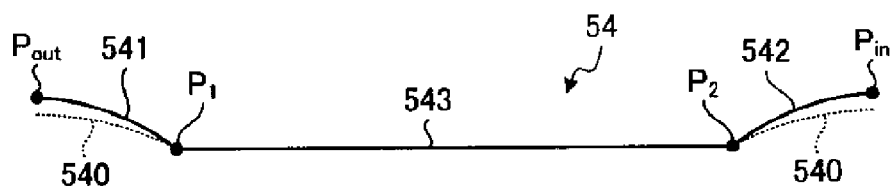
FIG. 7 is a schematic view illustrating another exemplary shape of the antenna.
Figure 8:
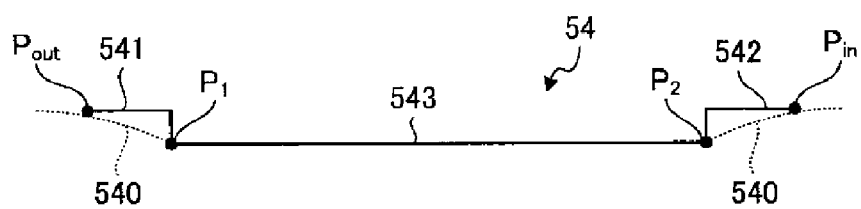
FIG. 8 is a schematic view illustrating another exemplary shape of the antenna.

In addition, in the case of a shape in which the distance z(x) is longer than the distance z(x) in a shape 540 expressed by Equation 6, the shapes of the end portions 541 and 542 of the antenna 54 may have a curved shape as illustrated in FIG. 7 or may have a stepped shape as illustrated in FIG. 8. In any case, the total length of the antenna 54 is an integral multiple of one half of the wavelength of supplied RF wave power.

In addition, when the electric field intensity E(x) on the bottom surface of the dielectric window 53 becomes too low, it may be difficult to ignite the plasma in the chamber 11. Therefore, the distance z(x) between the antenna 54 and the bottom surface of the dielectric window 53 is preferably a distance at which the electric field intensity within the range in which the plasma can be easily ignited can be radiated into the chamber 11.

[Amount of Generated Contamination]

Figure 9:
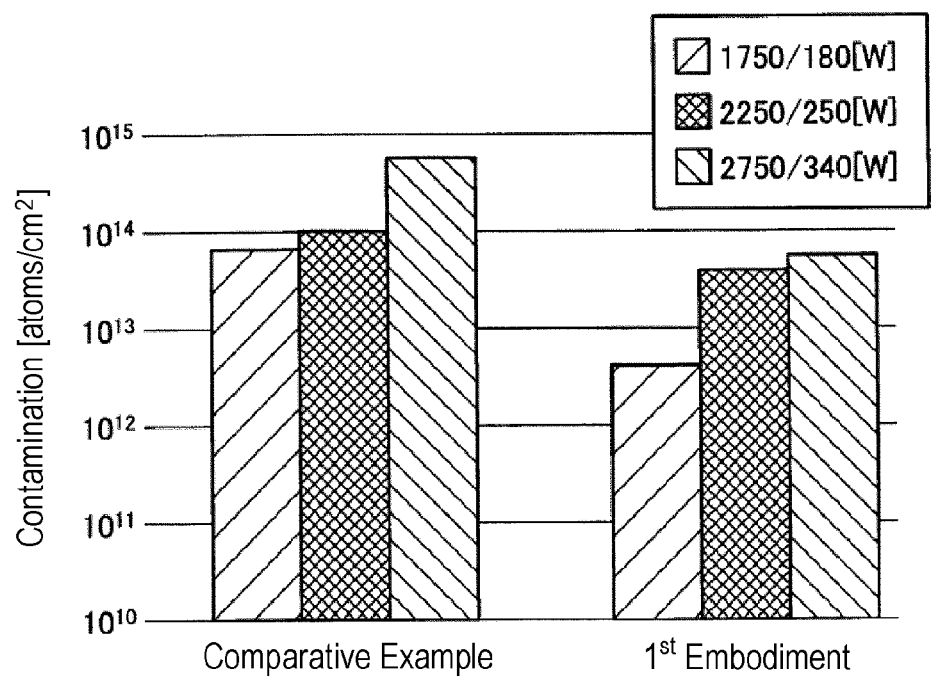
FIG. 9 is a view illustrating an example of an amount of generated contamination.

Next, a test was conducted in which plasma was generated in the chamber 11 and the amount of generated contamination in the chamber 11 was measured. FIG. 9 is a view illustrating an example of the amount of generated contamination. In FIG. 9, data of a comparative example in which the distance between the antenna 54 and the bottom surface of the dielectric window 53 is constant is also illustrated. "1750/180 [W]" in FIG. 9 means that the magnitude of RF power for plasma generation supplied to the antenna 54 is 1750 W, and the magnitude of RF power for bias supplied to the susceptor 21 is 180 W.

In the present embodiment, for example, as illustrated in FIG. 9, the amount of generated contamination is reduced by 30% or more compared with the comparative example regardless of the magnitude of RF power. Therefore, in the present embodiment, it is possible to reduce the amount of generated contamination compared with the comparative example.

[Processing Uniformity]

Figure 10:
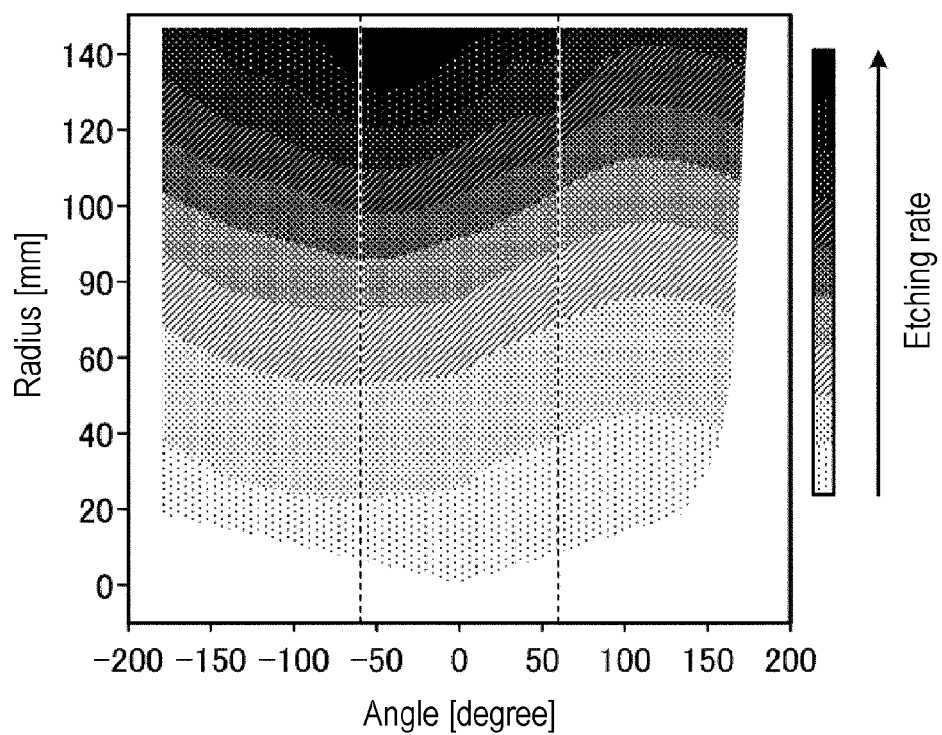
FIG. 10 is a view illustrating an example of distribution of an etching rate on a substrate in a comparative example.
Figure 11:
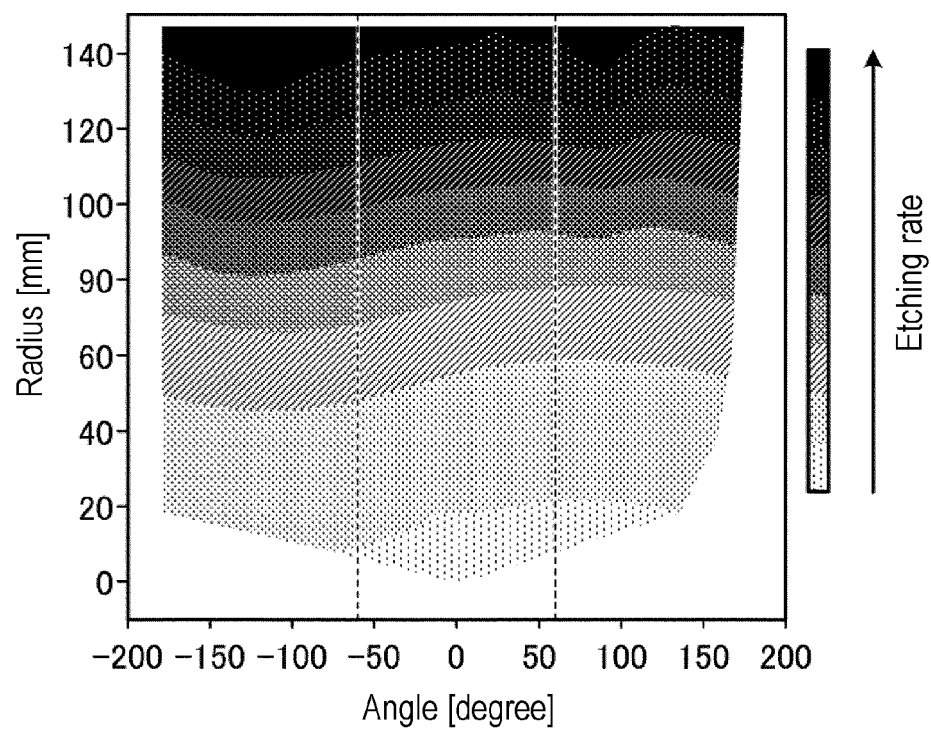
FIG. 11 is a view illustrating an example of distribution of an etching rate on the substrate in the first embodiment.

Next, a test was conducted to measure the distribution of an etching rate on the substrate W. FIG. 10 is a view illustrating an example of the distribution of an etching rate on the substrate W in a comparative example, and FIG. 11 is a view illustrating an example of the distribution of an etching rate on the substrate W in the first embodiment. In the comparative example, the distance between the antenna 54 and the bottom surface of the dielectric window 53 is constant. The end $P_{out}$ of the line of the antenna 54 is located in a direction of about −60 degrees from a reference direction, and the end $P_{in}$ is located in a direction of about +60 degrees from the reference direction.

Referring to FIG. 10, the etching rate is locally high in the vicinity of the edge of the substrate W close to the end $P_{in}$. In addition, the variation in the etching rate in the circumferential direction in the region in the vicinity of the edge is larger than the variation in the etching rate in the circumferential direction in the region close to the center of the substrate W.

Meanwhile, referring to FIG. 11, the variation in the etching rate in the circumferential direction in the region close to the central side of the substrate W and the variation in the etching rate in the circumferential direction in the region in the vicinity of the edge are suppressed to the same extent. In the vicinity of the edge of the substrate W, there is no region where the etching rate is locally high.

Figure 12:
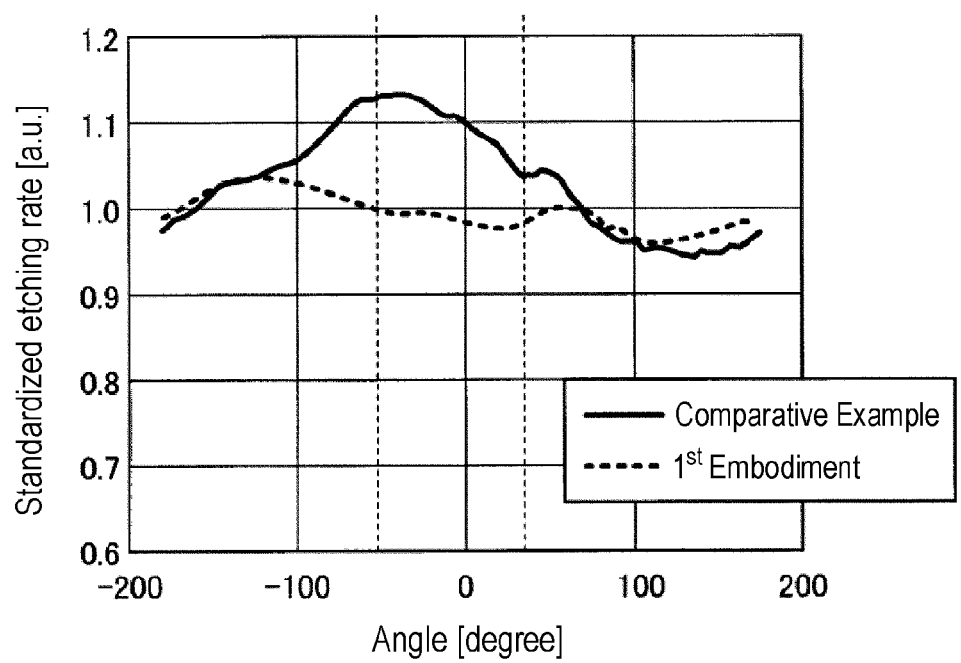
FIG. 12 is a view illustrating an example of distribution of an etching rate near an edge of the substrate in each of the comparative example and the first embodiment.

FIG. 12 is a view illustrating an example of the distribution of an etching rate near an edge of the substrate W in each of a comparative example and the first embodiment. In FIG. 12, in substrates W of 300 mm, standardized etching rates in the circumferential direction at the position of 147 mm from the centers of the substrates W are illustrated. The standardization is based on the average value of the etching rate in each of the comparative example and the first embodiment.

Referring to FIG. 12, the variation in the etching rate in the first embodiment is reduced compared with the variation in the etching rate in the comparative example. The variation in the etching rate in the first embodiment shows an improvement of about 61% compared with the variation in the etching rate in the comparative example. Therefore, in the present embodiment, it is possible to improve the uniformity of processing compared with the comparative example.

The first embodiment has been described above. As is clear from the above description, the plasma processing apparatus of the present embodiment includes the chamber 11, the dielectric window 53, the antenna 54, and the RF power supply 61. The chamber 11 accommodates the substrate W. The dielectric window 53 constitutes the upper portion of the chamber 11. The antenna 54 is provided above the chamber 11 via the dielectric window 53, and is formed of a conductive material such as copper in a linear shape. The antenna 54 generates plasma in the chamber 11 by radiating RF power into the chamber 11. The RF power supply 61 supplies RF power to the antenna 54. Opposite ends of the line constituting the antenna 54 are open, and power is fed to the midpoint of the line or in the vicinity of the midpoint of the line from the RF power supply 61, the vicinity of the midpoint of the line is grounded so that the antenna 54 resonates at a wavelength that is ½ of the wavelength of the RF wave power supplied from the RF power supply 61. The antenna 54 has the end portion 541, the end portion 542, and the intermediate portion 543. The end portion 541 is a portion of the antenna 54 on the end $P_{out}$ side of the position $P_1$ at the distance $\Delta L_1$ from the end $P_{out}$, which is one of the opposite ends of the line, toward the center of the line. The end portion 542 is a portion of the antenna 54 on the end $P_{in}$ side of the position $P_2$ at the distance $\Delta L_2$ from the end $P_{in}$, which is the other of the opposite ends of the line, toward the center of the line. The intermediate portion 543 is a portion of the antenna 54 between the end portion 541 and the end portion 542. The distance between the end portion 541 and the bottom surface of the dielectric window 53 and the distance between the end portion 542 and the bottom surface of the dielectric window 53 are each longer than the distance between the intermediate portion 543 and the bottom surface of the dielectric window 53. As a result, it is possible to suppress the occurrence of contamination and improve the uniformity of processing.

In addition, in the first embodiment, in the end portion 541, the distance between the end portion 541 and the bottom surface of the dielectric window 53 increases from the position $P_1$ to the end $P_{out}$ along the line of the antenna 54. In addition, in the end portion 542, the distance between the end portion 542 and the bottom surface of the dielectric window 53 increases from the position $P_2$ to the end $P_{in}$ along the line of the antenna 54. As a result, it is possible to suppress the generation of an excessive electric field on the bottom surface of the dielectric window 53 below the vicinity of each end of the antenna 54.

In addition, in the first embodiment described above, the distance between the end portion 541 and the bottom surface of the dielectric window 53 is a distance corresponding to the magnitude of the voltage generated at each position on the line of the end portion 541. In addition, the distance between the end portion 542 and the bottom surface of the dielectric window 53 is a distance corresponding to the magnitude of the voltage generated at each position on the line of the end portion 542. As a result, it is possible to suppress the electric field intensity generated on the bottom surface of the dielectric window 53 below the vicinity of each end of the antenna 54 to a predetermined value or less.

In addition, in the first embodiment described above, the distance between the end portion 541 and the bottom surface of the dielectric window 53 is a distance at which the electric field intensity generated on the bottom surface of the dielectric window 53 below the end portion 541 due to the voltage generated on the end portion 541 becomes equal to or less than a predetermined intensity. In addition, the distance between the end portion 542 and the bottom surface of the dielectric window 53 is a distance at which the electric field intensity generated on the bottom surface of the dielectric window 53 below the end portion 542 due to the voltage generated on the end portion 542 becomes equal to or less than a predetermined intensity. As a result, it is possible to suppress the electric field intensity generated on the bottom surface of the dielectric window 53 below the vicinity of each end of the antenna 54 to a predetermined value or less.

In the first embodiment described above, the bottom surface of the dielectric window 53 is flat. In addition, the end portion 541 extends away from the bottom surface of the dielectric window 53, from the position $P_1$ to the end $P_{out}$ along the line of the antenna 54. The end portion 542 extends away from the bottom surface of the dielectric window 53, from the position $P_2$ to the end $P_{in}$ along the line of the antenna 54.

Second Embodiment

In the first embodiment described above, with respect to the dielectric window 53 having a flat bottom surface, the antenna 54 is configured such that the distance between the vicinity of each end of the antenna 54 and the bottom surface of the dielectric window 53 is longer than the distance between the vicinity of the center of the antenna 54 and the bottom surface of the dielectric window 53. In contrast, in the present embodiment, with respect to an antenna 54 configured in a shape included in one plane, the dielectric window 53 is configured such that the bottom surface of the dielectric window 53 corresponding to the vicinity of each end of the antenna 54 protrudes in the direction away from the antenna 54. Even in this way, the distance between the vicinity of each end of the antenna 54 and the bottom surface of the dielectric window 53 may be made longer than the distance between the vicinity of the center of the antenna 54 and the bottom surface of the dielectric window 53.

Figure 13:
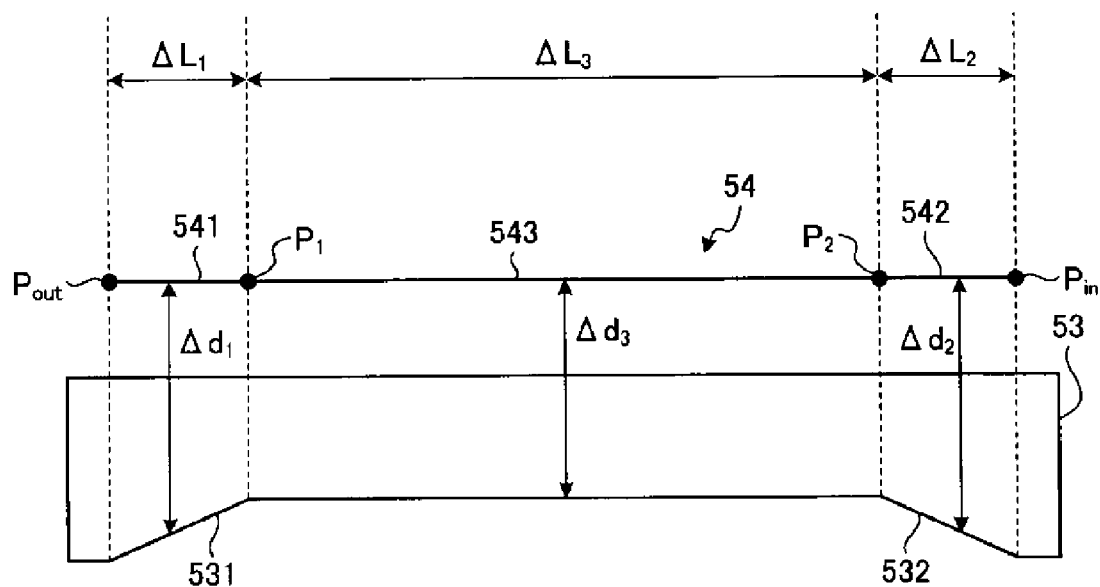
FIG. 13 is a schematic view illustrating exemplary shapes of an antenna and a dielectric window in a second embodiment.
Figure 14:
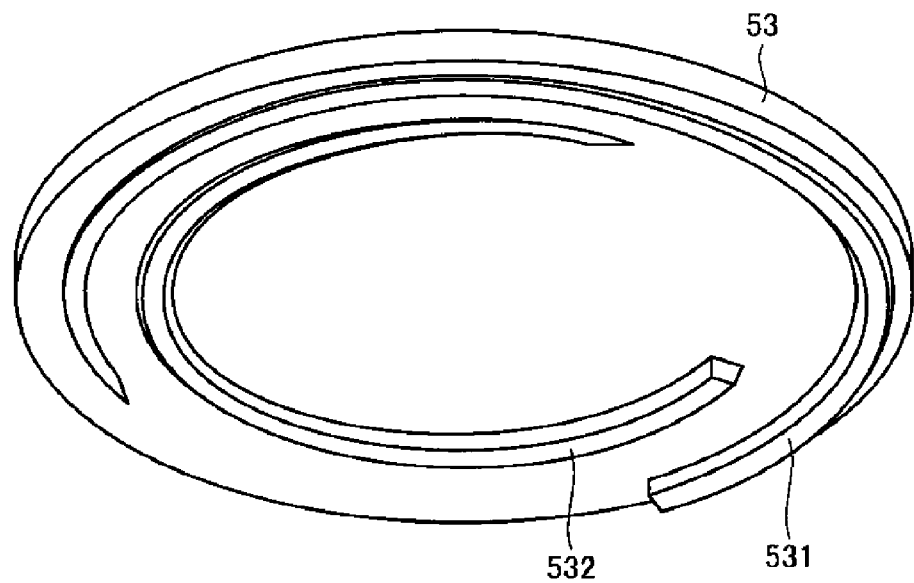
FIG. 14 is a schematic perspective view illustrating an example of a shape of the bottom surface of the dielectric window in the second embodiment.

FIG. 13 is a schematic view illustrating exemplary shapes of the antenna 54 and the dielectric window 53 in a second embodiment. FIG. 14 is a schematic perspective view illustrating an example of the shape of the bottom surface of the dielectric window 53 in the second embodiment. FIG. 13 schematically illustrates an example of the antenna 54 and an example of the dielectric window 53 when the antenna 54 is deployed along the extension direction of the line constituting the antenna 54. In the present embodiment, the antenna 54 is configured in a substantially circular spiral shape included in one plane.

In the present embodiment, the dielectric window 53 includes a protruded portion 531 that protrudes in a direction away from the antenna 54 on the bottom surface of the dielectric window 53 corresponding to the end portion 541 of the antenna 54, for example, as illustrated in FIGS. 13 and 14. The protruded portion 531 is formed along the line of the antenna 54 from the position $P_1$ toward the end $P_{out}$. In addition, the protruded portion 531 is formed such that the protrusion amount thereof in the direction away from the antenna 54 increases as approaching from the position corresponding to the position $P_1$ of the antenna 54 to the position corresponding to the end $P_{out}$.

In addition, in the present embodiment, the dielectric window 53 includes a protruded portion 532 that protrudes in a direction away from the antenna 54 on the bottom surface of the dielectric window 53 corresponding to the end portion 542 of the antenna 54, for example, as illustrated in FIGS. 13 and 14. The protruded portion 532 is formed along the line of the antenna 54 from the position $P_2$ toward the end $P_{in}$. In addition, the protruded portion 532 is formed such that the protrusion amount thereof in the direction away from the antenna 54 increases as approaching from the position corresponding to the position $P_2$ of the antenna 54 to the position corresponding to the end $P_{in}$.

Figure 15:
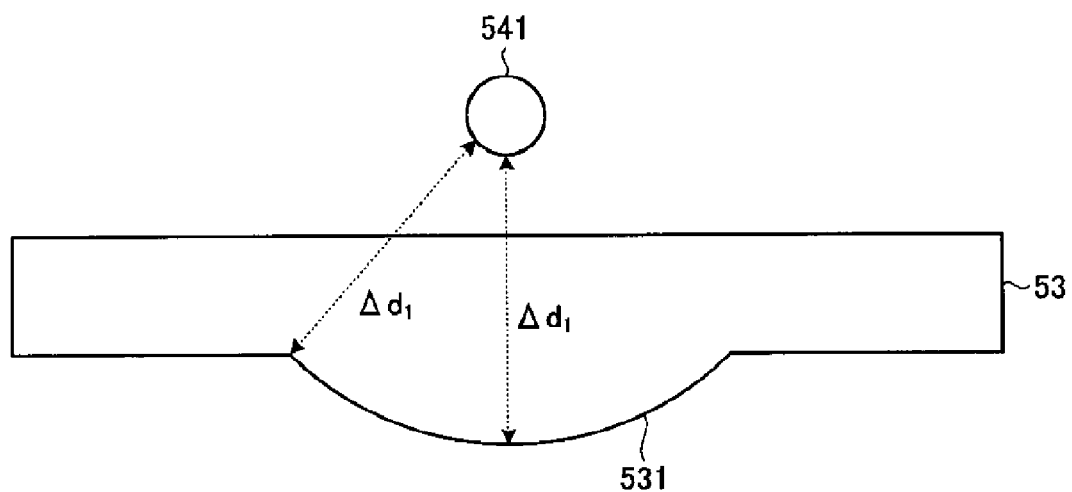
FIG. 15 is a cross-sectional view illustrating an example of shape of a protruded portion of the dielectric window around the antenna when viewed from a direction along the antenna.

A cross-sectional shape of the protruded portion 531 in the direction along the end portion 541 is preferably formed in a shape in which the distance between the surface of the end portion 541 and the bottom surface of the dielectric window 53 is $\Delta d_1$, for example, as illustrated in FIG. 15. Similarly, a cross-sectional shape of the protruded portion 532 in the direction along the end portion 542 is preferably formed in a shape in which the distance between the surface of the end portion 542 and the bottom surface of the dielectric window 53 is $\Delta d_2$.

Figure 16:
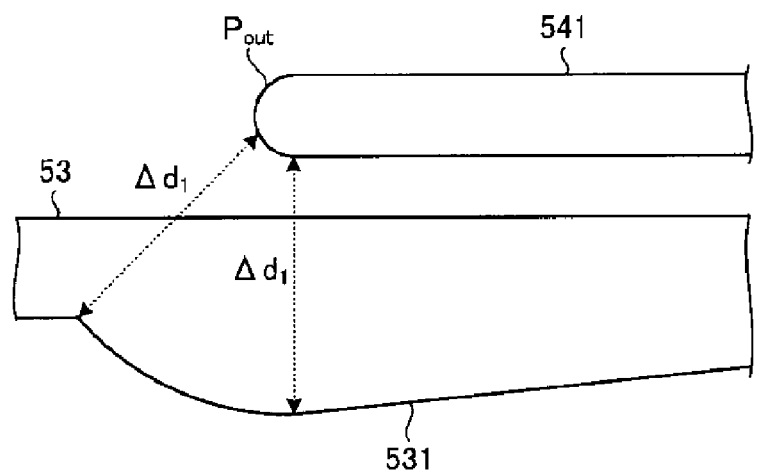
FIG. 16 is a cross-sectional view illustrating an example of a shape of a protruded portion of a dielectric window in the vicinity of an end portion of an antenna when viewed from a direction orthogonal to the antenna.

A cross-sectional shape of the protruded portion 531 in the vicinity of the end $P_{out}$ of the end portion 541 is preferably formed in a shape in which the distance between the surface of the end portion 541 and the bottom surface of the dielectric window 53 is $\Delta d_1$, for example, as illustrated in FIG. 16. Similarly, a cross-sectional shape of the protruded portion 532 in the vicinity of the end $P_{in}$ of the end portion 542 is preferably formed in a shape in which the distance between the surface of the end portion 542 and the bottom surface of the dielectric window 53 is $\Delta d_2$.

The second embodiment has been described above. As is clear from the above description, in the present embodiment, the bottom surface of the dielectric window 53 below the end portion 541 protrudes in a direction away from the antenna 54, and the protrusion amount thereof increases from the lower side of the position $P_1$ to the lower side of the end $P_{out}$ along the line of the antenna 54. In addition, the bottom surface of the dielectric window 53 below the end portion 542 protrudes in a direction away from the antenna 54, and the protrusion amount thereof increases from the lower side of the position $P_2$ to the lower side of the end $P_{in}$ along the line of the antenna 54. As a result, it is possible to suppress the occurrence of contamination and improve the uniformity of processing.

Third Embodiment

Figure 17:
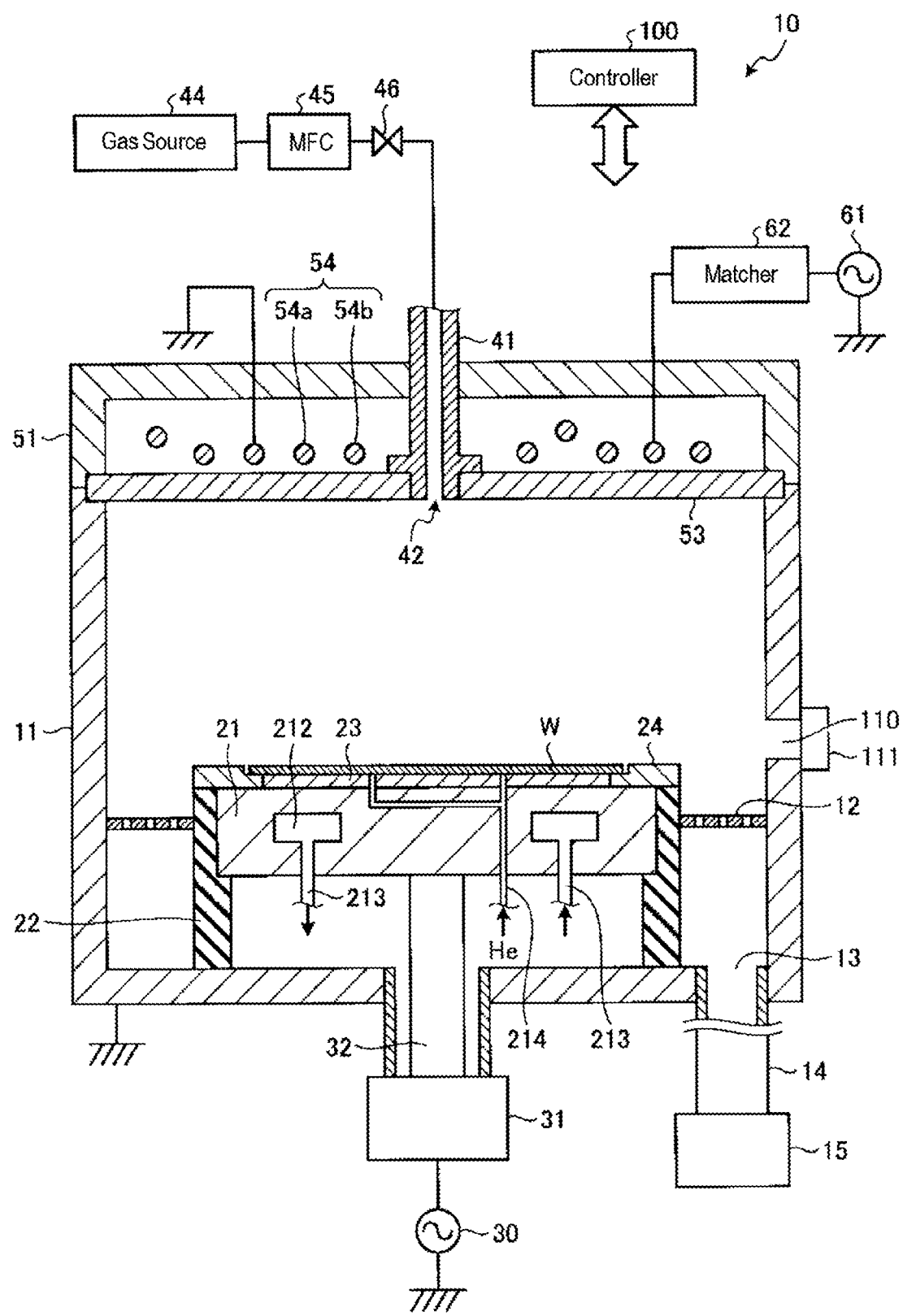
FIG. 17 is a schematic cross-sectional view illustrating an example of a plasma processing apparatus in a third embodiment.

In the first embodiment, plasma was generated by the antenna 54. In contrast, in the present embodiment, plasma is generated using two antennas. FIG. 17 is a schematic cross-sectional view illustrating an example of a plasma processing apparatus 10 in a third embodiment. Except for points described below, in FIG. 17, components denoted by the same reference numerals as those in FIG. 1 have the same or similar functions as the components in FIG. 1, and thus redundant descriptions thereof will be omitted.

The antenna 54 in the present embodiment has a first antenna 54a and a second antenna 54b. The first antenna 54a and the second antenna 54b are provided around the gas supply pipe 41 so as to surround the gas supply pipe 41. An RF power supply 61 is connected to the line constituting the first antenna 54a via a matcher 62. In addition, the line constituting the first antenna 54a is grounded at a position on the line different from the position on the line to which the RF power supply 61 is connected via the matcher 62.

The second antenna 54b is arranged inside the first antenna 54a, that is, between the first antenna 54a and the gas supply pipe 41. The second antenna 54b may be arranged outside the first antenna 54a as long as it is arranged in the vicinity of the first antenna 54a.

[Structure of Antenna 54]

Figure 18:
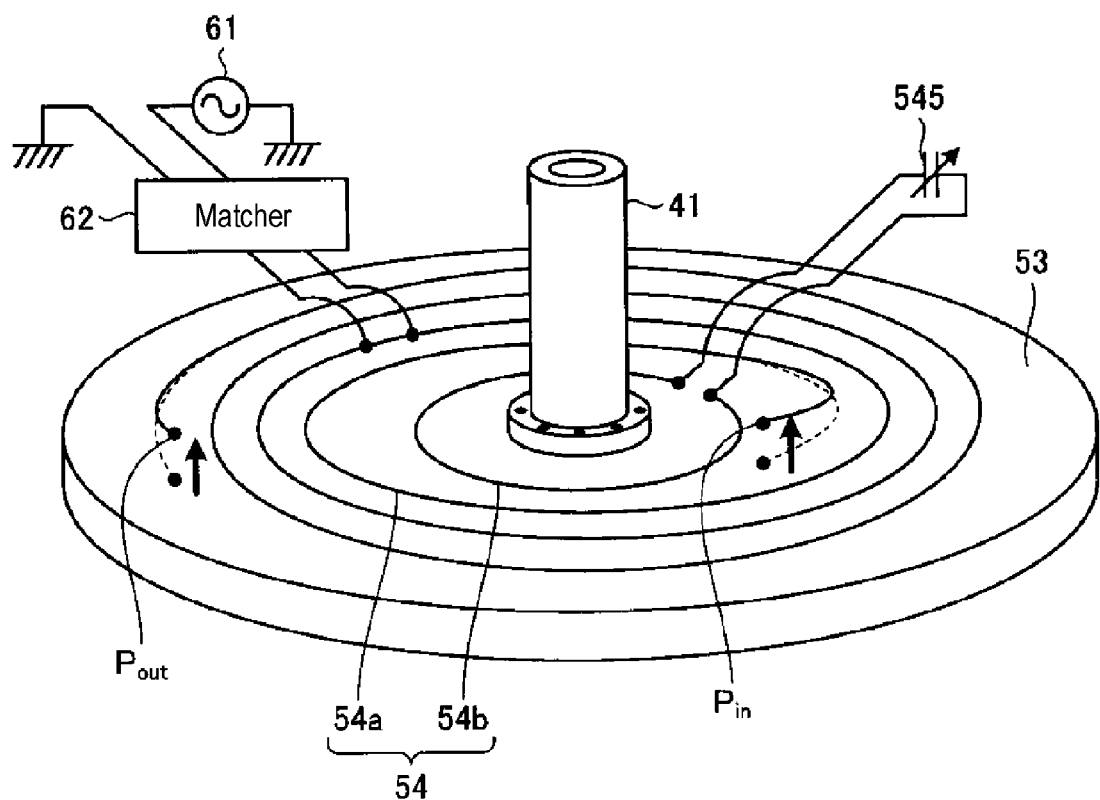
FIG. 18 is a schematic perspective view illustrating an example of an antenna in the third embodiment.

FIG. 18 is a schematic perspective view illustrating an example of the antenna 54 in the third embodiment. The antenna 54 in the present embodiment has the first antenna 54a and the second antenna 54b. The first antenna 54a is formed in a substantially circular spiral shape with two or more turns, for example, as illustrated in FIG. 18, and has, for example, a structure similar to that of the antenna 54 of the first embodiment illustrated in FIG. 2.

The second antenna 54b is formed in a ring shape, and opposite ends of the second antenna 54b are connected to each other via a capacitor 545. In the present embodiment, the capacitor 545 is a variable capacitance capacitor. The capacitor 545 may be a capacitor having a fixed capacitance. The second antenna 54b is inductively coupled to the first antenna 54a, and a current flows through the second antenna 54b in a direction in which the current cancels a magnetic field generated by the current flowing through the first antenna 54a. By adjusting the capacitance of the capacitor 545, it is possible to control the direction and magnitude of the current flowing through the second antenna 54b with respect to the current flowing through the first antenna 54a. The capacitance of the capacitor 545 is controlled by the controller 100.

The third embodiment has been described above. As is clear from the above description, the plasma processing apparatus 10 of the present embodiment includes the second antenna 54b formed in a ring shape and having opposite ends connected to each other via a capacitor, in addition to the first antenna 54a of the first embodiment. The second antenna 54b is provided inside or outside the spirally formed antenna 54. The first antenna 54a and the second antenna 54b are inductively coupled to each other. Even with this structure, it is possible to suppress the occurrence of contamination and improve the uniformity of processing.

Fourth Embodiment

Figure 19:
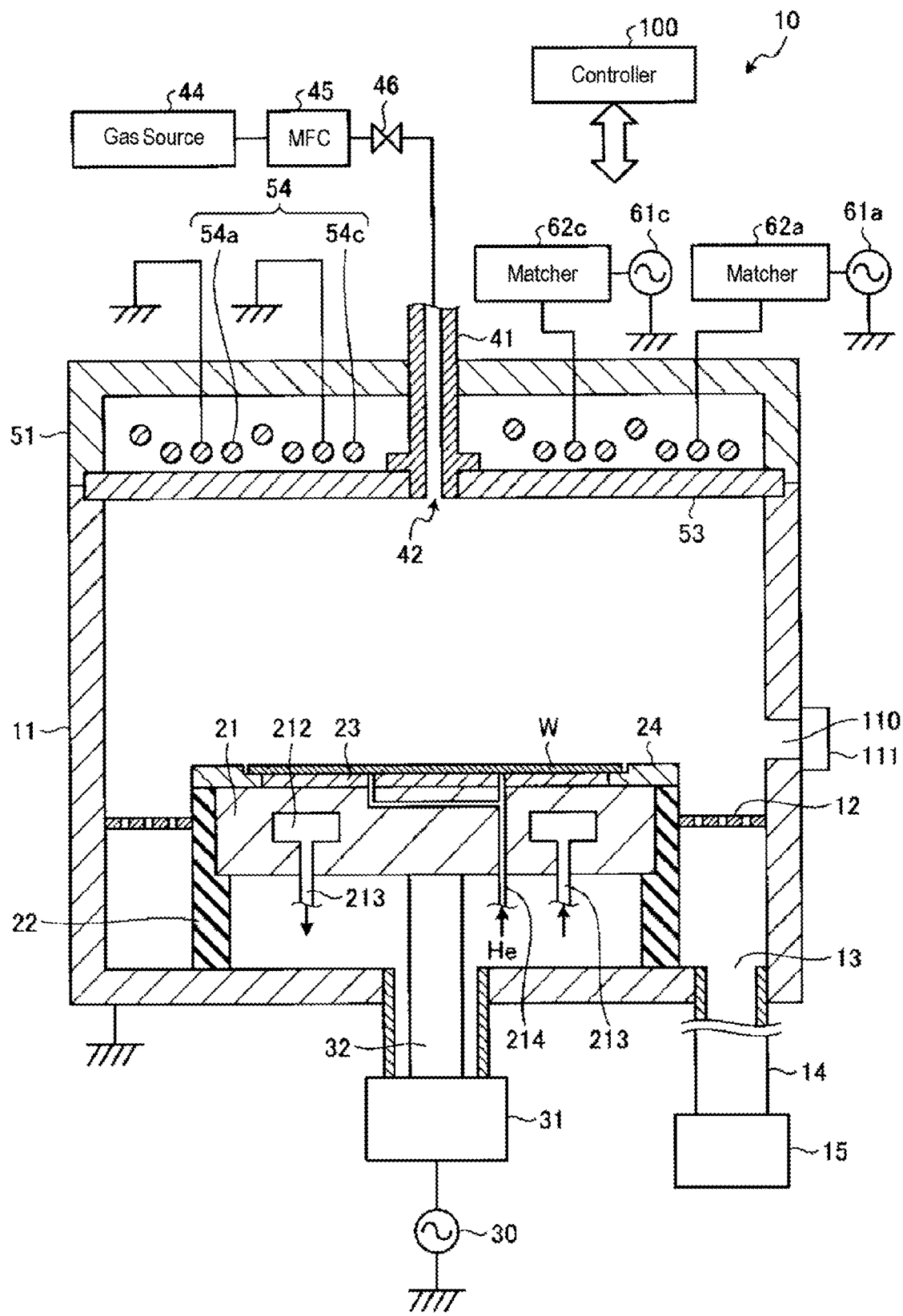
FIG. 19 is a schematic cross-sectional view illustrating an example of a plasma processing apparatus in a fourth embodiment.

In the first embodiment, plasma was generated by the antenna 54. In contrast, in the present embodiment, plasma is generated using two antennas. FIG. 19 is a schematic cross-sectional view illustrating an example of a plasma processing apparatus 10 in a fourth embodiment. Except for points described below, in FIG. 19, components denoted by the same reference numerals as those in FIG. 1 have the same or similar functions as the components in FIG. 1, and thus redundant descriptions thereof will be omitted.

The antenna 54 in the present embodiment has the first antenna 54a and a third antenna 54c. The first antenna 54a and the third antenna 54c are provided around the gas supply pipe 41 so as to surround the gas supply pipe 41. The first antenna 54a and the third antenna 54c are formed in a substantially circular spiral shape with two or more turns, and has, for example, a structure similar to that of the antenna 54 of the first embodiment illustrated in FIG. 2.

In the first antenna 54a, opposite ends of the line constituting the first antenna 54a are open, an RF power supply 61a is connected to the midpoint of the line or the vicinity of the midpoint via a matcher 62a, and the vicinity of the midpoint is grounded. As a result, the first antenna 54a resonates at a wavelength that is ½ of the wavelength of the RF wave power supplied from the RF power supply 61a.

In the third antenna 54c, opposite ends of the line constituting the third antenna Mc are open, an RF power supply 61ca is connected to the midpoint of the line or the vicinity of the midpoint via a matcher 62c, and the vicinity of the midpoint is grounded. As a result, the third antenna 54c resonates at a wavelength that is ½ of the wavelength of the RF wave power supplied from the RF power supply 61c.

In the present embodiment, the third antenna 54c is arranged inside the first antenna 54a, that is, between the first antenna 54a and the gas supply pipe 41. In addition, the third antenna 54c may be arranged outside the first antenna 54a, between the first antenna 54a and the dielectric window 53, or above the first antenna 54a as long as it is arranged in the vicinity of the first antenna 54a. The line constituting the first antenna 54a is an example of a first line, and the line constituting the third antenna 54c is an example of a second line.

Figure 20:
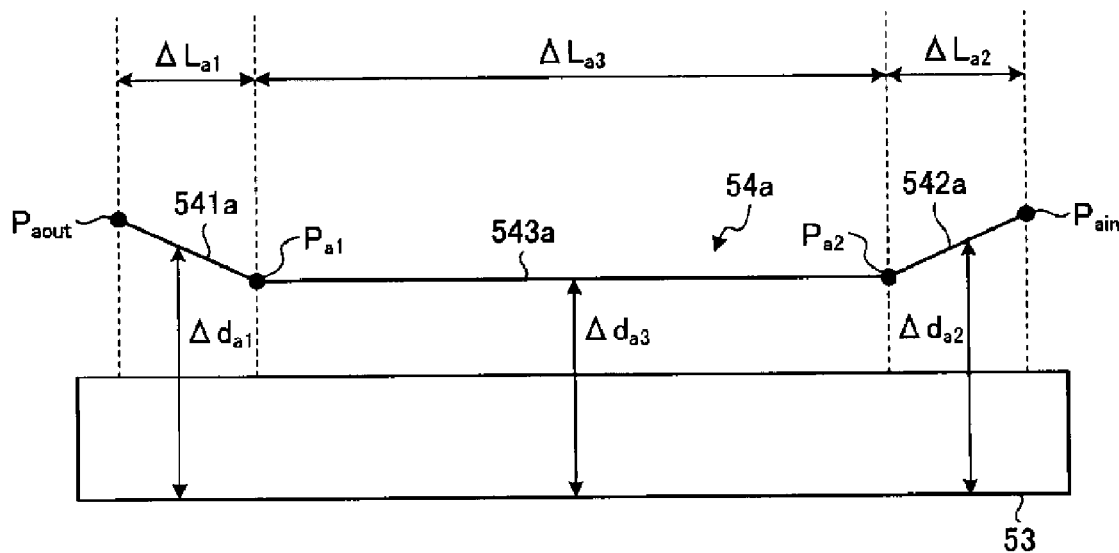
FIG. 20 is a schematic view illustrating an example of a shape of a first antenna in the fourth embodiment.

FIG. 20 is a schematic view illustrating an example of the shape of the first antenna 54a in the fourth embodiment. FIG. 20 schematically illustrates an example of the first antenna 54a and an example of the dielectric window 53 when the first antenna 54a and the dielectric window 53 are deployed along the extension direction of the line constituting the first antenna 54a. In the present embodiment, the bottom surface of the dielectric window 53 (the surface opposite to the surface on the first antenna 54a side) is flat.

In the example of FIG. 20, a position separated from an end $P_{aout}$ by a predetermined distance $\Delta L_{a1}$ along the line of the first antenna 54a is defined as $P_{a1}$, and a position separated from an end $P_{am}$ by a predetermined distance $\Delta L_{a2}$ along the line of the first antenna 54a is defined as $P_{a2}$. In addition, in the example of FIG. 20, an end portion 541a is a portion of the line in a range at the side close to the end $P_{aout}$ with reference to the position $P_{a1}$, and an end portion 542a is a portion of the line in a range at the side close to the end $P_{ain}$ with reference to the position $P_{a2}$. Furthermore, the intermediate portion 543a is a portion of the line in a range of a distance $\Delta L_{a3}$ from the position $P_{a1}$ to the position $P_{a2}$. The end $P_{aout}$ is an example of a first end, and the end $P_{ain}$ is an example of a second end. The position $P_{a1}$ is an example of a first position, and the position $P_{a2}$ is an example of a second position. In addition, the distance $\Delta L_{a1}$ is an example of a first distance, and the distance $\Delta L_{a2}$ is an example of a second distance. Furthermore, the end portion 541a is an example of a first portion, the end portion 542a is an example of a second portion, and the intermediate portion 543a is an example of a first intermediate portion.

In the present embodiment, a distance $\Delta d_{a1}$ between the end portion 541a of the first antenna 54a and the bottom surface of the dielectric window 53 is longer than a distance $\Delta d_{a3}$ between the intermediate portion 543a of the first antenna 54a and the bottom surface of the dielectric window 53, for example, as illustrated in FIG. 20. In addition, a distance $\Delta d_{a2}$ between the end portion 542a of the first antenna 54a and the bottom surface of the dielectric window 53 is longer than a distance $\Delta d_{a3}$ between the intermediate portion 543a of the first antenna 54a and the bottom surface of the dielectric window 53, for example, as illustrated in FIG. 20.

Figure 21:
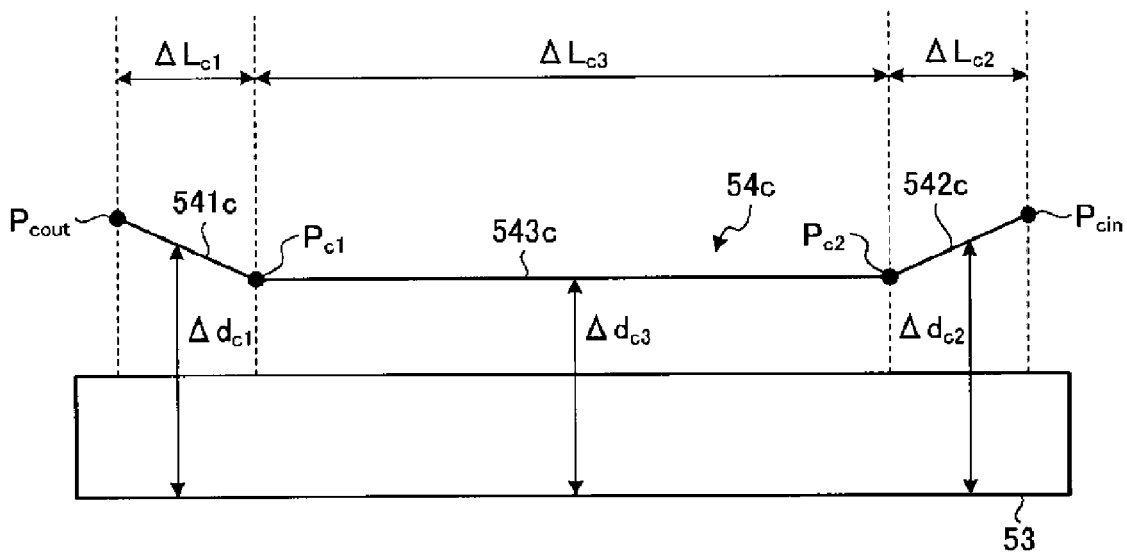
FIG. 21 is a schematic view illustrating an example of a shape of a third antenna in the fourth embodiment.

FIG. 21 is a schematic view illustrating an example of the shape of the third antenna 54c in the fourth embodiment. FIG. 21 schematically illustrates an example of the third antenna 54c and an example of the dielectric window 53 when the third antenna 54c and the dielectric window 53 are deployed along the extension direction of the line constituting the third antenna 54c. In the present embodiment, the bottom surface of the dielectric window 53 (the surface opposite to the surface on the third antenna 54c side) is flat.

In the example of FIG. 21, a position separated from an end $P_{cout}$ by a predetermined distance $\Delta L_{c1}$ along the line of the third antenna 54c is defined as $P_{c1}$, and a position separated from an end $P_{cin}$ by a predetermined distance $\Delta L_{c2}$ along the line of the third antenna 54c is defined as $P_2$. In addition, in the example of FIG. 21, an end portion 541c is a portion of the line in a range at the side close to the end $P_{cout}$ with reference to the position $P_{c1}$, and an end portion 542c is a portion of the line in a range at the side close to the end $P_{cin}$ with reference to the position $P_{c2}$. Furthermore, an intermediate portion 543c is a portion of the line in a range of a distance $\Delta L_{c3}$ from the position $P_{c1}$ to the position $P_{c2}$. The end $P_{cout}$ is an example of a third end, and the end $P_{cin}$ is an example of a fourth end. The position $P_{c1}$ is an example of a third position, and the position $P_{c2}$ is an example of a fourth position. In addition, the distance $\Delta L_{c1}$ is an example of a third distance, and the distance $\Delta L_{c2}$ is an example of a fourth distance. Furthermore, the end portion 541c is an example of a third portion, the end portion 542c is an example of a fourth portion, and the intermediate portion 543c is an example of a second intermediate portion.

In the present embodiment, the distance $\Delta d_{c1}$ between the end portion 541c of the third antenna 54c and the bottom surface of the dielectric window 53 is longer than the distance $\Delta d_{c3}$ between the intermediate portion 543c of the third antenna 54c and the bottom surface of the dielectric window 53, for example, as illustrated in FIG. 21. In addition, the distance $\Delta d_1$ between the end portion 542c of the third antenna 54c and the bottom surface of the dielectric window 53 is longer than the distance $\Delta d_{c3}$ between the intermediate portion 543c of the third antenna 54c and the bottom surface of the dielectric window 53, for example, as illustrated in FIG. 21.

The fourth embodiment has been described above. Even with this structure, it is possible to suppress the occurrence of contamination and improve the uniformity of processing.

[Others]

The present disclosure is not limited to the embodiments described above, and various modifications are possible within the scope of the gist thereof.

Figure 22:
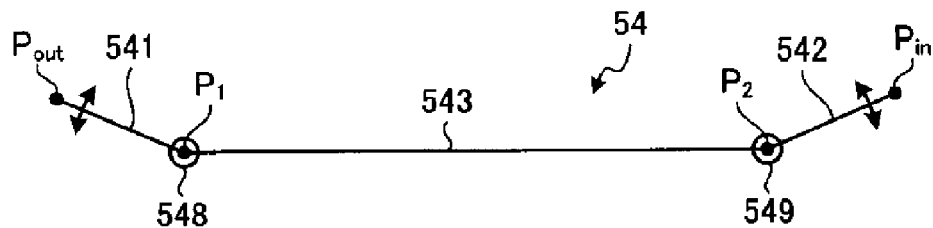
FIG. 22 is a schematic view illustrating another exemplary shape of the antenna.

For example, in the antenna 54 of the first embodiment described above, an angle between the intermediate portion 543 and the end portion 541 and an angle between the intermediate portion 543 and the end portion 542 are fixed. However, the technique disclosed herein is not limited thereto. For example, as illustrated in FIG. 22, a movable portion 548 may be provided at the position $P_1$ on the antenna 54, and the angle between the intermediate portion 543 and the end portion 541 may be changeable. Similarly, a movable portion 549 may be provided at the position $P_2$ on the antenna 54, and the angle between the intermediate portion 543 and the end portion 542 may be changeable. That is, the end portion 541 is rotatable in a direction away from the dielectric window 53 using the position $P_1$ as a fulcrum, and the end portion 542 is rotatable in a direction away from the dielectric window 53 using the position $P_2$ as a fulcrum.

As a result, for example, during the ignition of plasma, the angle between the intermediate portion 543 and the end portion 541 and the angle between the intermediate portion 543 and the end portion 542 may be increased, and the distance between the end portions 541 and 542 and the bottom surface of the dielectric window 53 may be decreased. In addition, after the ignition of plasma, the angle between the intermediate portion 543 and the end portion 541 and the angle between the intermediate portion 543 and the end portion 542 may be decreased, and the distance between the end portions 541 and 542 and the bottom surface of the dielectric window 53 may be increased. As a result, it is possible to more easily ignite plasma and to suppress the occurrence of contamination.

Further, even after the ignition of plasma, the angle between the intermediate portion 543 and the end portion 541 and the angle between the intermediate portion 543 and the end portion 542 may be changed according to the cumulative time of plasma processing. As a result, it is possible to suppress fluctuation in the state of plasma.

Figure 23A:
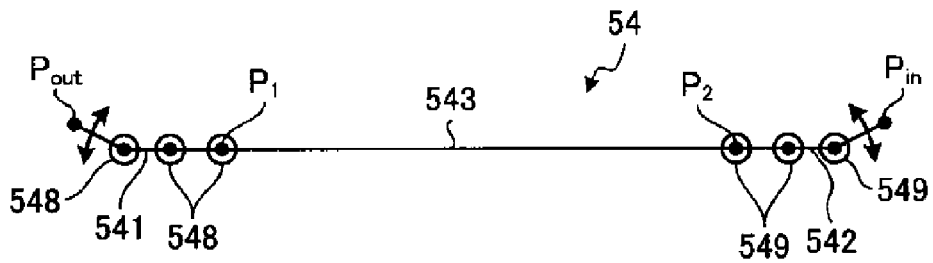
FIG. 23A is a schematic view illustrating another exemplary shape of the antenna.
Figure 23B:
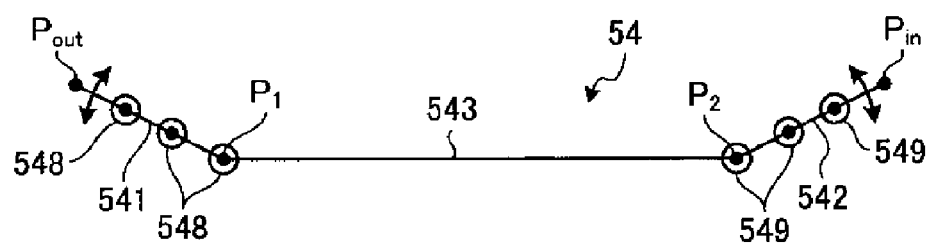
FIG. 23B is a schematic view illustrating another exemplary shape of the antenna.
Figure 23C:
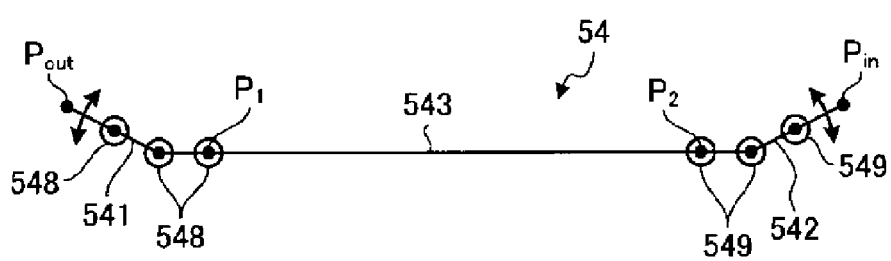
FIG. 23C is a schematic view illustrating another exemplary shape of the antenna.

In addition, a plurality of movable portions 548 and a plurality of movable portions 549 may be provided on the antenna 54, for example, as illustrated in FIGS. 23A to 23C. For example, during plasma ignition, the distance between the end portions 541 and 542 and the bottom surface of the dielectric window 53 is decreased by making the antenna 54 have a shape illustrated in FIG. 23A. As a result, it is possible to more easily ignite plasma. In addition, for example, after plasma ignition, the distance between the end portions 541 and 542 and the bottom surface of the dielectric window 53 is increased by making the antenna 54 have a shape illustrated in FIG. 23B. As a result, it is possible to suppress the occurrence of contamination. Further, for example, in the case in which electric field intensity radiated in the chamber 11 is decreased due to the deposition of reaction by-products on the bottom surface of the dielectric window 53, the distance between the end portions 541 and 542 and the bottom surface of the dielectric window 53 is decreased by making the antenna 54 have a shape illustrated in FIG. 23C. As a result, it is possible to suppress fluctuation in the state of plasma.

In FIGS. 23A to 23C, three movable portions 548 are provided in the end portion 541, but the number of movable portions 548 may be two or four or more. In FIGS. 23A to 23C, three movable portions 549 are provided in the end portion 542, but the number of movable portions 549 may be two or four or more.

In addition, the antenna 54 in the first embodiment, the second embodiment, and the fourth embodiment described above is formed in a substantially circular spiral shape, but the technique disclosed herein is not limited thereto. As another form, when the total length of the antenna 54 is an integral multiple of ½ of the wavelength of supplied RF wave power, the shape of the antenna 54 may have a ring shape (a substantially circular shape with only one turn), a straight line shape, a cross shape, a radial shape, a zigzag shape, or the like.

According to various aspects and embodiments of the present disclosure, it is possible to enhance the uniformity of processing while suppressing occurrence of contamination.

It shall be understood that the embodiments disclosed herein are examples in all respects and are not restrictive. Indeed, the above-described embodiments can be implemented in various forms. The embodiments described above may be omitted, replaced, or modified in various forms without departing from the scope and spirit of the appended claims.

What is claimed is:

1. A plasma processing apparatus comprising:
    a chamber in which a substrate is accommodated;
    a dielectric window constituting an upper portion of the chamber;
    a first antenna provided above the chamber via the dielectric window, and formed of a conductive material in a linear shape, the first antenna being configured to generate plasma within the chamber by radiating radio frequency (RF) power into the chamber; and
    a first power supply configured to supply the RF power to the first antenna,
    wherein opposite ends of a first line constituting the first antenna are open, power is fed to a midpoint of the first line or a vicinity of the midpoint from the first power supply, and the vicinity of the midpoint is grounded so that the first antenna is configured to resonate at a wavelength that is ½ of a wavelength of the RF power supplied from the first power supply,
    wherein the first antenna comprises:
        a first portion that is a portion of the first antenna at a side close to a first end, which is one of the opposite ends of the first line, with reference to a first position separated from the first end by a first distance toward a central portion of the first line;
        a second portion that is a portion of the first antenna at a side close to a second end, which is the other of the opposite ends of the first line, with reference to a second position separated from the second end by a second distance toward the central portion of the first line; and
        a first intermediate portion that is a portion of the first antenna between the first portion and the second portion,
    wherein a distance between the first portion and a bottom surface of the dielectric window and a distance between the second portion and the bottom surface of the dielectric window are each longer than a distance between the first intermediate portion and the bottom surface of the dielectric window, and
    wherein, in the first portion, the distance between the first portion and the bottom surface of the dielectric window increases from the first position to the first end along the first line of the first antenna, and in the second portion, the distance between the second portion and the bottom surface of the dielectric window increases from the second position to the second end along the first line of the first antenna.

2. The plasma processing apparatus of claim 1, wherein the bottom surface of the dielectric window is flat,
    the first portion extends away from the bottom surface of the dielectric window, from the first position to the first end along the first line of the first antenna, and
    the second portion extends away from the bottom surface of the dielectric window, from the second position to the second end along the first line of the first antenna.

3. The plasma processing apparatus of claim 1, wherein the bottom surface of the dielectric window below the first portion protrudes in a direction away from the first antenna, and a protrusion amount increases from a lower side of the first position to a lower side of the first end along the first line, and
    the bottom surface of the dielectric window below the second portion protrudes in a direction away from the first antenna, and a protrusion amount increases from a lower side of the second position to a lower side of the second end along the first line.

4. The plasma processing apparatus of claim 1, further comprising:
    a second antenna formed in a ring shape and having opposite ends connected to each other via a capacitor, the second antenna being provided inside or outside the first antenna formed in a ring shape or a spiral shape,
    wherein the first antenna and the second antenna are inductively coupled to each other.

5. The plasma processing apparatus of claim 1, further comprising:
    a third antenna provided above the chamber and formed of a conductive material in a ring shape, the third antenna being provided inside or outside the first antenna formed in a ring shape and configured to radiate RF power into the chamber so as to generate plasma inside the chamber; and
    a second power supply configured to supply the RF power to the third antenna,
    wherein opposite ends of a second line constituting the third antenna are open, power is fed to a midpoint of the second line or a vicinity of the midpoint from the second power supply, and the vicinity of the midpoint is grounded so that the third antenna is configured to resonate at a wavelength that is ½ of a wavelength of the RF power supplied from the second power supply, and
    wherein the third antenna comprises:
        a third portion that is a portion of the third antenna at a side close to a third end, which is one of the opposite ends of the second line, with reference to a third position separated from the third end by a third distance toward a central portion of the second line;
        a fourth portion that is a portion of the third antenna at a side close to a fourth end, which is the other of the opposite ends of the second line, with reference to a fourth position separated from the fourth end by a fourth distance toward the central portion of the second line; and
        a second intermediate portion that is a portion of the third antenna between the third portion and the fourth portion,
    wherein a distance between the third portion and the bottom surface of the dielectric window and a distance between the fourth portion and the bottom surface of the dielectric window are each longer than a distance between the second intermediate portion and the bottom surface of the dielectric window.

6. The plasma processing apparatus of claim 1, wherein in the first portion and the second portion, a distance z (x) between the first antenna and the bottom surface of the dielectric window at a position spaced apart from a center of the first line by a distance x along the first line satisfies the following equation:

$$z(x) \geq \alpha V_m \sin\left(\frac{\pi}{2L}x\right)\frac{1}{2\pi E_{max}},$$

where α is a proportionality constant, $V_m$ is a maximum value of a voltage generated in the first line, 2 L is a length of the first line, and $E_{max}$ is a maximum electric field intensity which is generated on the bottom surface of the dielectric window and at which contamination does not occur from the bottom surface of the dielectric window.

7. The plasma processing apparatus of claim 6, wherein the bottom surface of the dielectric window is flat,
the first portion extends away from the bottom surface of the dielectric window, from the first position to the first end along the first line of the first antenna, and
the second portion extends away from the bottom surface of the dielectric window, from the second position to the second end along the first line of the first antenna.

8. The plasma processing apparatus of claim 7, wherein the first portion is configured to be rotatable in a direction away from the dielectric window using the first position as a fulcrum, and the second portion is configured to be rotatable in a direction away from the dielectric window using the second position as a fulcrum.

9. The plasma processing apparatus of claim 4, wherein the bottom surface of the dielectric window below the first portion protrudes in a direction away from the first antenna, and a protrusion amount increases from a lower side of the first position to a lower side of the first end along the first line, and
the bottom surface of the dielectric window below the second portion protrudes in a direction away from the first antenna, and a protrusion amount increases from a lower side of the second position to a lower side of the second end along the first line.

10. The plasma processing apparatus of claim 9, further comprising:
a second antenna formed in a ring shape and having opposite ends connected to each other via a capacitor, the second antenna being provided inside or outside the first antenna formed in a ring shape or a spiral shape,
wherein the first antenna and the second antenna are inductively coupled to each other.

11. The plasma processing apparatus of claim 10, further comprising:
a third antenna provided above the chamber and formed of a conductive material in a ring shape, the third antenna being provided inside or outside the first antenna formed in a ring shape and configured to radiate RF power into the chamber so as to generate plasma inside the chamber; and
a second power supply configured to supply the RF power to the third antenna,
wherein opposite ends of a second line constituting the third antenna are open, power is fed to a midpoint of the second line or a vicinity of the midpoint from the second power supply, and the vicinity of the midpoint is grounded so that the third antenna is configured to resonate at a wavelength that is ½ of a wavelength of the RF power supplied from the second power supply, and
wherein the third antenna comprises:
a third portion that is a portion of the third antenna at a side close to a third end, which is one of the opposite ends of the second line, with reference to a third position separated from the third end by a third distance toward a central portion of the second line;
a fourth portion that is a portion of the third antenna at a side close to a fourth end, which is the other of the opposite ends of the second line, with reference to a fourth position separated from the fourth end by a fourth distance toward the central portion of the second line; and
a second intermediate portion that is a portion of the third antenna between the third portion and the fourth portion,
wherein a distance between the third portion and the bottom surface of the dielectric window and a distance between the fourth portion and the bottom surface of the dielectric window are each longer than a distance between the second intermediate portion and the bottom surface of the dielectric window.

12. A plasma processing apparatus comprising:
a chamber in which a substrate is accommodated;
a dielectric window constituting an upper portion of the chamber;
a first antenna provided above the chamber via the dielectric window, and formed of a conductive material in a linear shape, the first antenna being configured to generate plasma within the chamber by radiating radio frequency (RF) power into the chamber; and
a first power supply configured to supply the RF power to the first antenna,
wherein opposite ends of a first line constituting the first antenna are open, power is fed to a midpoint of the first line or a vicinity of the midpoint from the first power supply, and the vicinity of the midpoint is grounded so that the first antenna is configured to resonate at a wavelength that is ½ of a wavelength of the RF power supplied from the first power supply,
wherein the first antenna comprises:
a first portion that is a portion of the first antenna at a side close to a first end, which is one of the opposite ends of the first line, with reference to a first position separated from the first end by a first distance toward a central portion of the first line;
a second portion that is a portion of the first antenna at a side close to a second end, which is the other of the opposite ends of the first line, with reference to a second position separated from the second end by a second distance toward the central portion of the first line; and
a first intermediate portion that is a portion of the first antenna between the first portion and the second portion,
wherein a distance between the first portion and a bottom surface of the dielectric window and a distance between the second portion and the bottom surface of the dielectric window are each longer than a distance between the first intermediate portion and the bottom surface of the dielectric window, and wherein in the first portion and the second portion, a distance z (x) between the first antenna and the bottom surface of the dielectric window at a position spaced apart from a center of the first line by a distance x along the first line satisfies the following equation:

$$z(x) \geq \alpha V_m \sin\left(\frac{\pi}{2L}x\right)\frac{1}{2\pi E_{max}},$$

where $\alpha$ is a proportionality constant, $V_m$ is a maximum value of a voltage generated in the first line, 2 L is a length of the first line, and $E_{max}$ is a maximum electric field intensity which is generated on the bottom surface of the dielectric window and at which contamination does not occur from the bottom surface of the dielectric window.

13. The plasma processing apparatus of claim 12, wherein the bottom surface of the dielectric window is flat,
the first portion extends away from the bottom surface of the dielectric window, from the first position to the first end along the first line of the first antenna, and
the second portion extends away from the bottom surface of the dielectric window, from the second position to the second end along the first line of the first antenna.

14. The plasma processing apparatus of claim 13, wherein the first portion is configured to be rotatable in a direction away from the dielectric window using the first position as a fulcrum, and the second portion is configured to be rotatable in a direction away from the dielectric window using the second position as a fulcrum.

\* \* \* \* \*